US007023730B2

(12) United States Patent
Kouno

(10) Patent No.: US 7,023,730 B2
(45) Date of Patent: Apr. 4, 2006

(54) NONVOLATILE SEMICONDUCTOR MEMORY DEVICE AND WRITING METHOD THERETO

(75) Inventor: Kazuyuki Kouno, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 154 days.

(21) Appl. No.: 10/780,721

(22) Filed: Feb. 19, 2004

(65) Prior Publication Data

US 2004/0228177 A1 Nov. 18, 2004

(30) Foreign Application Priority Data

Feb. 21, 2003 (JP) ......................... P. 2003-044450

(51) Int. Cl.
*G11C 16/12* (2006.01)

(52) U.S. Cl. ........................... 365/185.12; 365/185.11; 365/185.22; 365/189.09; 365/189.05

(58) Field of Classification Search ........... 365/185.12, 365/185.11, 185.22, 189.09, 189.05
See application file for complete search history.

(56) References Cited

U.S. PATENT DOCUMENTS

| | | | | |
|---|---|---|---|---|
| 6,172,917 | B1 * | 1/2001 | Kataoka et al. | 365/189.05 |
| 6,477,087 | B1 * | 11/2002 | Tanaka et al. | 365/185.22 |
| 6,731,538 | B1 * | 5/2004 | Noda et al. | 365/185.11 |

FOREIGN PATENT DOCUMENTS

| | | |
|---|---|---|
| JP | 7-226097 | 8/1995 |
| JP | 11-328981 | 11/1999 |

* cited by examiner

*Primary Examiner*—Van Thu Nguyen
*Assistant Examiner*—Toan Le
(74) *Attorney, Agent, or Firm*—McDermott Will & Emery LLP

(57) ABSTRACT

A write circuit arranged per a bit line or a plurality of bit lines includes a plurality of latch circuits for storing data written to a plurality of pages and bit line connection circuits for connecting the plurality of latch circuits and bit lines and performs write operation to a plurality of pages by repeating continuous program operation which continuously performs program operations on a plurality of pages while a voltage generating circuit is continuously generating a voltage necessary for program operation and continuous verify operation which continuously performs verify operations on a plurality of pages while the voltage generating circuit is continuously generating a voltage necessary for verify operation.

36 Claims, 12 Drawing Sheets

NONVOLATILE SEMICONDUCTOR MEMORY DEVICE AND WRITING METHOD THERETO

The present application is based on Japanese Patent Application No. 2003-044450, which is incorporated herein by reference.

BACKGROUND OF THE INVENTION

1. Field of the Invention

The present invention relates to a nonvolatile semiconductor memory device capable of electrically overwriting data, and in particular to a nonvolatile semiconductor memory device capable of writing data at a high speed and a writing method thereto.

2. Description of the Related Art

In recent years, a nonvolatile semiconductor memory device, in particular a flash memory has been used in a variety of applications because it is capable of electrically overwriting data and retains data even when the power is turned OFF. For example, a flash memory is used as a storage for storing data in a portable terminal such as a cell phone, a digital camera, or a silicon audio player. The flash memory is mounted as storage for storing programs on a system LSI of a microcomputer. This reduces the development period of a device where the flash memory is set.

Data write time of a flash memory is relatively long, on the order of microseconds. Typically, a plurality of data items are previously stored into a latch circuit and then the plurality of data items stored in the latch circuit are written as a single unit, thereby reducing the effective write time.

The write operation of a related art flash memory (a nonvolatile semiconductor memory device) is described below referring to FIGS. 13 through 16 (for example, refer to Unexamined Japanese Patent Publication No. Hei-7-226097 or Unexamined Japanese Patent Publication No. Hei-11-328981.

FIG. 13 shows the configuration of the memory cell array and write circuit of a related art flash memory (a nonvolatile semiconductor memory device). In FIG. 13, the memory cell array 1 is a NOR-type flash memory cell array. To be more specific, the memory cell array 1 comprises word lines WL1, WL2 (only two word lines are shown) and bit lines BL1 through BLN. At the intersections of word lines and bit lines are arranged memory cells M11 through M2N in a matrix shape. A control gate for the memory cells is connected to the word lines WL1, WL2, a drain to bit lines BL1, BL2, a source a source line SL, and a substrate to a well line PW. The source for the memory cells M11 through M2N is connected to a common source line SL and the substrate to a common well line PW to form a single erase block.

Bit line reset circuits are respectively connected to the bit lines BL1 through BLN. The bit line reset circuit connected to the bit line BL1 is described below. The bit line reset circuit consists of a bit line reset transistor RT1. The bit line reset transistor RT1 has a gate connected to a bit line reset control signal BLRST, a source connected to a ground potential, and a drain connected to a bit line BL1. The bit line reset transistor RT1 plays a role of setting the bit line BL1 to the ground potential by way of the bit line reset control signal BLRST. The same circuit is connected to each of the bit line reset circuits connected to the bit lines BL2 through BLN.

Write circuits 2-1 through 2-N are respectively connected to the bit lines BL1 through BLN. A write circuits is arranged for each bit line, so that it is possible to perform batch write operation to all memory cells connected to a single word line with single write operation. For example, N memory cells M11 through M1N connected to the word line WL1 comprises Page 1, and selecting the word line WL1 in write operation performs batch write to Page 1. Similarly, N memory cells M21 through M2N connected to the word line WL2 comprises Page 2, and selecting the word line WL2 in write operation performs batch write to Page 2.

Next, the configuration of write circuits 2-1 through 2-N connected to all bit lines is described taking as an example the write circuit 2-1 connected to the bit line BL1.

The write circuit 2-1 comprises a latch circuit LAT including inverters INV1 and INV2, a transfer gate TG including an N-channel transistor TGN and a P-channel transistor TGP, and a latch data storage switch TN including a N-channel transistor.

The latch circuit LAT is a circuit which temporarily latches write data. To the power supply for the inverters INV1 and INV2 is supplied the output voltage VPP of a positive high voltage generating circuit (not shown in FIG. 13).

The transfer gate TG is a switch for connecting or interrupting the output N1 of the latch circuit LAT and the bit line BL1 and is controlled by a transfer gate control signal TGS. The transfer gate control signal TGS is connected to the gate of the N-channel transistor TGN. The output signal of the inverter ILS to which the transfer gate control signal TGS is input is connected to the gate of the P-channel transistor TGP. To the power supply for the inverter ILS and the substrate of the P-channel transistor TGP is supplied a high voltage VPP.

The latch data storage switch TN is a switch for connecting or interrupting external input data IO and the input N2 of the latch circuit LAT. The output signal of an AND logical element AND to which a data latch control signal DL and a latch selection signal LATSEL are input is connected to the gate of the latch data storage switch TN. When write data is stored into a predetermined latch circuit, both the data latch control signal DL and the latch selection signal LATSEL are driven HIGH to open the latch data storage switch TN thereby setting external input data IO to the latch circuit LAT.

When program data (0 data) is stored, the output N1 of the latch circuit LAT is set to HIGH. When erase data (1 data) is stored, the output N1 of the latch circuit LAT is set to LOW. After the data is stored, the latch data storage switch TN closes to retain write data in the latch circuit LAT.

While the configuration of the write circuit connected to the bit line BL1 has been described, same circuits are connected to the write circuits 2-2 through 2-N connected to the bit lines BL2 through BLN.

Write operation of the write circuit thus configured is described below.

FIG. 14 is a flowchart explaining the write operation of a related art flash memory (nonvolatile semiconductor memory device). The flowchart shows a case where write operation is performed to the memory cell for Page 1 connected to the word line WL1 and the memory cell for Page 2 connected to the word line WL2.

First, input of a program command starts the write operation (step S100). To perform Page 1 write operation (Page Program1), Page 1 write data is stored into the latch circuit LAT (step S110) After data latch is complete, Page 1 program operation is performed (step S120).

After the program operation is over, verify operation is performed to check that data has been properly written into the memory cell for Page 1 (step S130). In case it is determined that there is a memory cell where data, even single-bit data, is not properly written in the verify operation (this case is hereinafter called fail), program operation and verify operation are performed again (step S140). A plurality of program operations and verify operations are performed and in case it is determined that all memory cells on Page 1 have been properly written (this case is hereinafter called pass), Page 1 write operation is complete, followed by Page 2 write operation (Page Program2).

Same as Page 1 write operation, Page 2 write operation is performed by data latch operation (step S150), program operation (step S160), verify operation (step S170), and repetition of program operation and verify operation until verify operation has been passed (step S180). A plurality of program operations and verify operations are performed and in case verify operation has been passed, Page 2 write operation is complete and Page 1 and Page 2 write operations are terminated (step S190).

FIG. 15 is a timing chart explaining the write operation of a related art flash memory (nonvolatile semiconductor memory device). The timing chart shows the operation waveforms of a data latch control signal DL, the output voltage VPP of a positive high voltage generating circuit (not shown in FIG. 13), the output voltage VNN of a negative high voltage generating circuit (not shown in FIG. 13), and word lines WL1, W2.

In Page 1 write operation (Page Program1), in the first place, data latch to the latch circuit LAT is performed by way of the data latch control signal DL (Data Latch1). In the data latch period, the word lines WL1, WL2, the source line SL, and the well line PW are set to the ground potential. The transfer gate TG is in the inactive state while the bit line reset circuit is in the active state and the bit line is set to the ground potential.

After data latch is over, the system makes a transition to the program mode. The positive high voltage generating circuit and the negative high voltage generating circuit respectively generate high voltages of 5 V (VPP) and −8 V (VNN) necessary for program operation. Once the output voltages VPP, VNN of the positive high voltage generating circuit and the negative high voltage generating circuit have reached predetermined voltages, the word line WL1 is set to −8 V, the source line SL is placed in the high impedance state, the bit line reset circuit in the inactive state, and the transfer gate TG in the active state, then the output N1 of the latch circuit LAT is connected to the bit lines. This starts program operation.

In case program data (0 data) is stored in the latch circuit LAT, the output N1 of the latch circuit LAT is set to HIGH so that a positive high voltage of 5 V is applied to the bit lines. In case erase data (1 data) is stored in the latch circuit LAT, the output N1 of the latch circuit LAT is set to LOW so that a ground potential (0 v) is applied to the bit lines.

A voltage of −8 V is applied to the control gate (word lines) for the memory cell. When a voltage of 5 V is applied to the drain (bit lines), a high electric field is applied to the tunnel oxide film and electrons accumulated at the floating gate by way of an FN (Foeler-Nordheim) current is drawn toward the drain, which executes the program. When a ground voltage (0 V) is applied to the drain (bit lines), a high electric field to generate an FN current on the tunnel oxide film is not applied so that the memory cell program is not executed. After the program is executed for a predetermined period, the word line WL1 and the source line SL are set to a ground potential, the transfer gate TG is placed in the inactive state and the bit line reset circuit in the active state, then the bit lines are set to a ground potential. This completes program operation and makes a transition to the verify mode.

After the system has made a transition to the verify mode, the positive high voltage generating circuit and the negative high voltage generating circuit respectively generate a power supply voltage VDD and the voltage of a ground potential VSS, After the output voltages VPP, VNN of the positive high voltage generating circuit and the negative high voltage generating circuit have reached predetermined voltages, the bit line reset circuit is placed in the inactive state and the transfer gate TG in the active state to pre-charge only bit lines corresponding to program data (output N1 of the latch circuit LAT is HIGH) to the power supply voltage VDD.

After pre-charging of the bit lines is over, the transfer gate TG is placed in the inactive state, and the latch circuit is isolated from the bit lines and a voltage of 1 V is applied to the word line WL1.

In case the threshold voltage of the memory cells is less than 1 V, that is, in case the memory cells are properly programmed, the bit lines are discharged via the memory cells and the potential of the bit lines decreases toward the ground potential. In case the threshold voltage of the memory cells is 1 V or more, that is, in case the memory cells are not properly programmed, the bit lines are not discharged via the memory cells and the potential of the bit lines is maintained at the power supply voltage VDD.

After a predetermined period has elapsed, the transfer gate TG is placed in the active state and the latch circuit LAT is connected to the bit lines. In case the threshold voltage of the memory cells is less than 1 V, that is, in case the memory cells are properly programmed, the output N1 of the latch circuit LAT is driven LOW (erase data) because the bit lines are discharged to the ground potential, and the subsequent program is not executed. In case the threshold voltage of the memory cells is 1 V or more, that is, in case the memory cells are not properly programmed, the output N1 of the latch circuit LAT is maintained at the first set data, and the program is executed again in the subsequent program operation.

After a predetermined period has elapsed, verify operation is terminated by setting the word line W1 to the ground potential, placing the transfer gate TG in the inactive state and the bit line reset circuit in the active state to set the bit lines to the ground potential. In case it is determined that there remains program data, even single-bit data (fail), program operation (Program1) and verify operation (Verify1) are performed again.

In case the latch data in all latch circuits have been overwritten with erase data by a plurality of program operations and verify operations (pass), Page 1 write operation is complete. Then Page 2 write operation (Page Program 2) on WL2 is performed. Same as Page 1 write operation, Page 2 write operation is performed by repetition of data latch operation (Data Latch2), program operation (Program2) and verify operation (Verify2).

FIG. 16 shows the write command and the internal operation state of a related art flash memory (nonvolatile semiconductor memory device). In the first place, a program command CM1 and a program address AD1 on Page 1 are input. Then Page 1 write data is input. Inputting a program command CM2 after write data has been input provides the busy state, which starts Page 1 write operation. The write operation is executed by repeating program operation and verify operation. In case verify operation has been passed, Page 1 write operation is complete. After Page 1 write operation is complete, the system enters the ready state, allowing Page 2 write operation.

Next, the program command CM1 and a program address AD2 on Page 2 are input. Then Page 2 write data is input. Inputting a program command CM2 after write data has been input provides the busy state, which starts Page 2 write operation. Same as Page 1, Page 2 write operation is executed by repeating program operation and verify operation. In case verify operation has been passed, Page 2 write operation is complete.

The aforementioned related art nonvolatile semiconductor memory device (flash memory) has the following problems. Firstly, data latch time to store write data into a latch circuit is required. In recent years, the storage capacity of a nonvolatile semiconductor memory device has been growing. By increasing the number of bits (number of batch write bits) per page, the effective write time has been reduced. However, with an increase in the number of write bits per page, the data latch time in data write to a single page increases thus increasing the write time. A nonvolatile semiconductor memory device in recent years may require a long data latch time per page on the order of microseconds, which has significant effects on the increase in the write time.

Secondly, program operation and verify operation are repeated in the write operation to a page. Thus the high voltage generating circuit must generate a voltage required for program operation or verify operation each time program operation or verify operation takes place. This means that time until the predetermined voltage output from the high voltage generating circuit is stabilized, that is, the voltage output stabilization wait time is needed before starting verify operation. For example, referring to FIG. 15, it is necessary to wait as long as the time Tps before the output voltages VPP, VNN of the high voltage generating circuit are stabilized in program operation. It is also necessary to wait as long as the time Tpvs before the output voltages VPP, VNN of the high voltage generating circuit are stabilized in verify operation. The voltage output stabilization wait time is on the order of microseconds, which increases the write time. The increase in the storage capacity of a nonvolatile semiconductor memory device increases the number of cycles of program operation and verify operation and the voltage output stabilization wait time has great effects on the increase in the write time.

Thirdly, program operation and verify operation are repeated in the write operation to a single page. It is thus necessary to apply a program voltage or verify voltage on word lines each time program operation or verify operation takes place. As a result, the word line voltage rise time and fall time are required for each of program operation and verify operation. For example, in FIG. 15, the fall time Tp1 is required to apply a voltage of −8 V to the word lines at the start of program operation. The rise time Tp2 is required to drive the word lines to the ground potential at the end of program operation. The rise time Tpv1 is required to apply a voltage of −1 V to the word lines at the start of verify operation. The fall time Tpv2 is required to drive the word lines to the ground potential at the end of verify operation. The increase in the storage capacity of a nonvolatile semiconductor memory device increases the number of cycles of program operation and verify operation and the word line rise time and fall time have great effects on the increase in the write time.

SUMMARY OF THE INVENTION

The invention has been accomplished in view of the aforementioned problems and aims at providing a nonvolatile semiconductor memory device capable of writing data at a high speed and a writing method thereto.

In order to solve the problems, the first aspect of the invention provides a nonvolatile semiconductor memory device comprising: a plurality of word lines; a plurality of bit lines; a memory cell array including memory cells arranged in a matrix shape at the intersections of the plurality of word lines and the plurality of bit lines; a write circuit arranged per a bit line or a plurality of bit lines in order to perform batch write operation to a page including the plurality of memory cells; and a voltage generating circuit for generating a voltage necessary for write operation; the write circuit comprising: a plurality of latch circuits for storing data written to a plurality of pages; and bit line connection circuits for connecting the plurality of latch circuits and bit lines; wherein the nonvolatile semiconductor memory device further comprises a control circuit for performing write operation to a plurality of pages by repeating continuous program operation which sequentially selects data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation which sequentially selects data written to a plurality of pages stored in the plurality of latch circuits while continuously operating the voltage generating circuit to cause the circuit to continuously generate a voltage necessary for verify operation thereby continuously performing verify operation on a plurality of pages.

With this configuration, in the continuous program operation, it is possible to perform program operation while the voltage generation circuit is outputting a voltage necessary for program operation. This reduces the program voltage output stabilization wait time of the voltage generating circuit thus reducing the program time. In the continuous verify operation, it is possible to perform verify operation while the voltage generation circuit is outputting a voltage necessary for verify operation. This reduces the verify voltage output stabilization wait time of the voltage generating circuit thus reducing the verify time. As a result, high-speed data write is allowed. Moreover, write operation to next page is allowed by simply switching between bit line connection circuits, which ensures high-speed data write operation.

The second aspect of the invention provides the nonvolatile semiconductor memory device according to the first aspect, wherein the nonvolatile semiconductor memory device further comprises a control circuit for setting write data to the latch circuits other than that for a selected page during program operation or verify operation of write data stored in the latch circuit for the selected page.

With this configuration, write data can be set to the latch circuits other than that for a selected page in parallel with the program operation or verify operation on the selected page. This reduces the data latch time thus allowing high-speed data write operation.

The third aspect of the invention provides the nonvolatile semiconductor memory device according to the first aspect, wherein the nonvolatile semiconductor memory device further comprises a level shift circuit for converting the output voltage level of the latch circuit to a high voltage level between the plurality of latch circuits and the bit line connection circuits.

With this configuration, it is possible to change the voltage of the power supply for the latch circuits to a power supply voltage thus allowing stable latch retaining operation. Moreover, data latch in program operation is made easy.

The fourth aspect of the invention provides the nonvolatile semiconductor memory device according to the first aspect, wherein the nonvolatile semiconductor memory device further comprises a detection circuit for detecting that memory cells are properly programmed during verify operation, a plurality of latch data reset circuits capable of individually resetting latch data in the plurality of latch circuits, and latch data reset selection circuits for selecting a predetermined latch data reset circuit in order to reset latch data in a predetermined latch circuit in case the detection circuit has detected that the memory cells are properly programmed.

With this configuration, it is possible to share a bit line detection circuit among a plurality of latch circuits thus reducing the circuit scale of the write circuit. Latch data can be reset without fail by tuning the capability of the latch data reset circuit. Moreover, latch data reset operation is allowed even in case a level shift circuit is inserted between the latch circuits and the bit line connection circuits.

The fifth aspect of the invention provides a nonvolatile semiconductor memory device comprising: a plurality of word lines; a plurality of bit lines; a memory cell array including memory cells arranged in a matrix shape at the intersections of the plurality of word lines and the plurality of bit lines; a write circuit arranged per a bit line or a plurality of bit lines in order to perform batch write operation to a page including the plurality of memory cells; and a voltage generating circuit for generating a voltage necessary for write operation, the write circuit comprising: a serial connection latch group where a plurality of latch circuits are connected serially to store data written to a plurality of pages; and a bit line connection circuit for connecting the latch circuit in the final stage of the serial connection latch group and bit lines; wherein the nonvolatile semiconductor memory device further comprises: a latch data transfer control circuit for transferring latch data in each circuit of the serial connection latch group in a ring shape by transferring latch data in each latch circuit of the serial connection latch group to the latch circuit in the next stage and transferring latch data in the latch circuit in the final stage to the latch circuit in the first stage; and a control circuit for performing write operation to a plurality of pages by repeating continuous program operation on a plurality of pages which transfers in a ring shape the data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation on a plurality of pages which transfers in a ring shape the data written to a plurality of pages stored in the plurality of latch circuits while continuously operating the voltage generating circuit to cause the circuit to continuously generate a voltage necessary for verify operation thereby continuously performing verify operation on a plurality of pages.

With this configuration, it is possible, in the continuous program operation, to perform program operation on a plurality of pages while the voltage generation circuit is outputting a voltage necessary for program operation. This reduces the program voltage output stabilization wait time of the voltage generating circuit thus reducing the program time. In the continuous verify operation, it is possible to perform verify operation on a plurality of pages while the voltage generation circuit is outputting a voltage necessary for verify operation. This reduces the verify voltage output stabilization wait time of the voltage generating circuit thus reducing the verify time. As a result, high-speed data write is allowed. Further, write operation to next page is allowed by simply shifting latch data, which ensures high-speed data write operation. Moreover, it is possible to share a bit line connection circuit among a plurality of latch circuits thus reducing the circuit scale of the write circuit.

The sixth aspect of the invention provides the nonvolatile semiconductor memory device according to the fifth aspect, wherein the nonvolatile semiconductor memory device further comprises a control circuit for setting write data to the latch circuits other than that for the selected page during program operation or verify operation of write data stored in the latch circuit for the selected page.

With this configuration, it is possible to set write data to the latch circuits other than that for a selected page in parallel with the program operation or verify operation on the selected page. This reduces the data latch time thus allowing high-speed data write operation.

The seventh aspect of the invention provides the nonvolatile semiconductor memory device according to the fifth aspect, wherein the nonvolatile semiconductor memory device further comprises a level shift circuit for converting the output voltage level of the latch circuit in the final stage to a high voltage level between the latch circuit in the final stage of the serial connection latch group and the bit line connection circuit.

With this configuration, it is possible to change the voltage of the power supply for the latch circuits to a power supply voltage thus allowing stable latch retaining operation. Moreover, data latch in program operation is made easy.

The eighth aspect of the invention provides the nonvolatile semiconductor memory device according to the fifth aspect, wherein the nonvolatile semiconductor memory device further comprises a detection circuit for detecting that memory cells are properly programmed during verify operation and a latch data reset circuit for resetting the latch data in the latch circuit in the final stage of the serial connection latch group in case the detection circuit has detected that the memory cells are properly programmed.

With this configuration, it is possible to reset latch data without fail by tuning the capability of the latch data reset circuit. Moreover, latch data reset operation is allowed even in case a level shift circuit is inserted between the latch circuits and the bit line connection circuits.

The ninth aspect of the invention provides the nonvolatile semiconductor memory device according to the first or fifth aspect, wherein the plurality of latch circuits comprise flip-flop circuits.

With this configuration, data storage and latch data transfer to a plurality of latch circuits are made possible by simply inputting a clock. Thus data storage and latch data transfer to latch circuits are made easy.

The tenth aspect of the invention provides the nonvolatile semiconductor memory device according to the first or fifth aspect, wherein the nonvolatile semiconductor memory device further comprises a control circuit for performing continuous program operation and continuous verify operation on the pages where write data setting is complete, the page being other than the selected page, until setting of write data to the latch circuit for the selected page is complete, while setting write data to the latch circuit for the selected page.

With this configuration, it is possible to perform continuous program operation and continuous verify operation on the other pages in parallel while performing data latch on a single page for a prolonged time. This allows efficient write operation and ensures high-speed data write operation.

The eleventh aspect of the invention provides the nonvolatile semiconductor memory device according to the first or fifth aspect, wherein the nonvolatile semiconductor memory device further comprises a control circuit for skipping program operation and verify operation on the selected page and performing program operation and verify operation on the next page in case the write data stored in the latch circuit for the selected page contains no program data.

With this configuration, it is possible to perform write operation to the next page while skipping the write operation to a page whose write data contains no program data or a page where write operation is complete. This eliminates useless program operation and verify operation thus allowing high-speed data write operation.

The twelfth aspect of the invention provides the nonvolatile semiconductor memory device according to the first or fifth aspect, wherein the nonvolatile semiconductor memory device further comprises a control circuit for setting data written to a new page to the latch circuit for a page where the write operation is complete during the subsequent program operation or verify operation on the next page in case it has been detected that the memory cells for the selected page are properly programmed in the verify operation on the selected page.

With this configuration, it is possible to store data written to a new page into the latch circuit for a page where write operation is complete during the subsequent program operation or verify operation on the next page. This reduces the data latch time for the next page thus allowing high-speed data write operation.

The thirteenth aspect of the invention provides the nonvolatile semiconductor memory device according to the first or fifth aspect, the memory cell array comprising memory cells for a plurality of pages connected to a single word line, wherein the nonvolatile semiconductor memory device further comprises a control circuit for performing the continuous program operation with a voltage necessary for program operation continuously applied to the word line.

With this configuration, it is possible to perform continuous program operation on a plurality of pages connected to a single word line with a program voltage continuously applied to a word line. This reduces the voltage rise time and fall time of the word line in program operation thus allowing high-speed program operation. Further, it is possible to reduce the recharging/discharging count of the word line thereby providing low-power program operation.

The fourteenth aspect of the invention provides the nonvolatile semiconductor memory device according to the first or fifth aspect, the memory cell array comprising memory cells for a plurality of pages connected to a single word line, wherein the nonvolatile semiconductor memory device further comprises a control circuit for performing the continuous verify operation with a voltage necessary for verify operation continuously applied to the word line.

With this configuration, it is possible to perform continuous verify operation on a plurality of pages connected to a single word line with a verify voltage continuously applied to a word line. This reduces the voltage rise time and fall time of the word line in verify operation thus allowing high-speed verify operation. Further, it is possible to reduce the recharging/discharging count of the word line thereby providing low-power verify operation.

The fifteenth aspect of the invention provides the nonvolatile semiconductor memory device according to the first or fifth aspect, the memory cell array comprising memory cells for a plurality of pages connected to a single word line, wherein the nonvolatile semiconductor memory device further comprises a bit line reset circuit for setting non-selected bit lines to a ground potential during the continuous program operation or the continuous verify operation.

With this configuration, it is possible to set bit lines for non-selected pages to a ground potential during program operation or verify operation on a selected page. This makes it possible to perform program operation or verify operation on the next page without waiting for the bit line for the selected page to be reset to the ground potential, after completion of program operation or verify operation on the selected page. As a result, high-speed data write operation is allowed.

The sixteenth aspect of the invention provides a method of writing to a nonvolatile semiconductor memory device comprising: a plurality of word lines; a plurality of bit lines; a memory cell array including memory cells arranged in a matrix shape at the intersections of the plurality of word lines and the plurality of bit lines; a write circuit arranged per a bit line or a plurality of bit lines; the write circuit comprising: a plurality of latch circuits for storing data written to a plurality of pages; and a bit line connection circuit for connecting the plurality of latch circuits and bit lines in order to perform batch write operation to a page including the plurality of memory cells; and a voltage generating circuit for generating a voltage necessary for write operation; wherein the method performs write operation to a plurality of pages by repeating continuous program operation on a plurality of pages which sequentially selects data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation on a plurality of pages which sequentially selects data written to a plurality of pages stored in the plurality of latch circuits while continuously operating the voltage generating circuit to cause the circuit to continuously generate a voltage necessary for verify operation thereby continuously performing verify operation on a plurality of pages.

With this writing method, it is possible, in the continuous program operation, to perform program operation on a plurality of pages while the voltage generation circuit is outputting a voltage necessary for program operation. This reduces the program voltage output stabilization wait time of the voltage generating circuit thus reducing the program time. In the continuous verify operation, it is possible to perform verify operation on a plurality of pages while the voltage generation circuit is outputting a voltage necessary for verify operation. This reduces the verify voltage output stabilization wait time of the voltage generating circuit thus reducing the verify time. As a result, high-speed data write is allowed. Further, write operation to next page is allowed by simply switching between bit line connection circuits, which ensures high-speed data write operation.

The seventeenth aspect of the invention provides the method of writing to a nonvolatile semiconductor memory device according to the sixteenth aspect, wherein the method sets write data to the latch circuits other than that for the selected page during program operation or verify operation of write data stored in the latch circuit for the selected page.

With this writing method, it is possible to set write data to the latch circuits other than that for a selected page in parallel with the program operation or verify operation on the selected page. This reduces the data latch time thus allowing high-speed data write operation.

The eighteenth aspect of the invention provides a method of writing to a nonvolatile semiconductor memory device comprising: a plurality of word lines; a plurality of bit lines; a memory cell array including memory cells arranged in a matrix shape at the intersections of the plurality of word lines and the plurality of bit lines; a write circuit arranged per a bit line or a plurality of bit lines in order to perform batch write operation to a page including the plurality of memory cells, the write circuit comprising: a serial connection latch group where a plurality of latch circuits are connected serially to store data written to a plurality of pages; and a bit line connection circuit for connecting the latch circuit in the final stage of the serial connection latch group and bit lines; a latch data transfer control circuit for transferring latch data in each circuit of the serial connection latch group in a ring shape by transferring latch data in each latch circuit of the serial connection latch group to the latch circuit in the next stage and transferring latch data in the latch circuit in the final stage to the latch circuit in the first stage; and a voltage generating circuit for generating a voltage necessary for write operation; wherein the method performs write operation to a plurality of pages by repeating continuous program operation on a plurality of pages which transfers in a ring shape the data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation on a plurality of pages which transfers in a ring shape the data written to a plurality of pages stored in the plurality of latch circuits while continuously operating the voltage generating circuit to cause the circuit to continuously generate a voltage necessary for verify operation thereby continuously performing verify operation on a plurality of pages.

With this writing method, it is possible, in the continuous program operation, to perform program operation on a plurality of pages while the voltage generating circuit is outputting a voltage necessary for program operation. This reduces the program voltage output stabilization wait time of the voltage generating circuit thus reducing the program time. In the continuous verify operation, it is possible to perform verify operation on a plurality of pages while the voltage generation circuit is outputting a voltage necessary for verify operation. This reduces the verify voltage output stabilization wait time of the voltage generating circuit thus reducing the verify time. As a result, high-speed data write is allowed. Further, write operation to next page is allowed by simply shifting latch data, which ensures high-speed data write operation. Moreover, it is possible to share a bit line connection circuit among a plurality of latch circuits thus reducing the circuit scale of the write circuit.

The nineteenth aspect of the invention provides the method of writing to a nonvolatile semiconductor memory device according to the eighteenth aspect, wherein write data setting is made to the latch circuits other than that for the selected page during program operation or verify operation of write data stored in the latch circuit for the selected page.

With this writing method, write data can be set to the latch circuits other than that for a selected page in parallel with the program operation or verify operation on the selected page. This reduces the data latch time thus allowing high-speed data write operation.

The twentieth aspect of the invention provides the method of writing to a nonvolatile semiconductor memory device according to the sixteenth or eighteenth aspect, wherein the method performs continuous program operation and continuous verify operation on the pages where write data setting is complete, the page being other than the selected page, until setting of write data to the latch circuit for the selected page is complete, while setting write data to the latch circuit for the selected page.

With this writing method, it is possible to perform continuous program operation and continuous verify operation on the other pages in parallel while performing data latch on a single page for a prolonged time. This allows efficient write operation and ensures high-speed data write operation.

The twenty-first aspect of the invention provides the method of writing to a nonvolatile semiconductor memory device according to the sixteenth or eighteenth aspect, wherein the method skips program operation and verify operation on the selected page and performs program operation and verify operation on the next page in case the write data stored in the latch circuit for the selected page contains no program data.

With this writing method, it is possible to perform write operation to the next page while skipping the write operation to a page whose write data contains no program data or a page where write operation is complete. This eliminates useless program operation and verify operation thus allowing high-speed data write operation.

The twenty-second aspect of the invention provides the method of writing to a nonvolatile semiconductor memory device according to the sixteenth or eighteenth aspect, wherein the method sets data written to a new page to the latch circuit for a page where the write operation is complete during the subsequent program operation or verify operation on the next page in case it has been detected that the memory cells for the selected page are properly programmed in the verify operation on the selected page.

With this writing method, it is possible to store data written to a new page into the latch circuit for a page where write operation is complete during the subsequent program operation or verify operation on the next page. This reduces the data latch time for the next page thus allowing high-speed data write operation.

The twenty-third aspect of the invention provides the method of writing to a nonvolatile semiconductor memory device according to the sixteenth or eighteenth aspect, the memory cell array comprising memory cells for a plurality of pages connected to a single word line, wherein the method performs the continuous program operation with a voltage necessary for program operation continuously applied to the word line.

With this writing method, it is possible to perform continuous program operation on a plurality of pages connected to a single word line with a program voltage continuously applied to a word line. This reduces the voltage rise time and fall time of the word line in program operation thus allowing high-speed program operation. Further, it is possible to reduce the recharging/discharging count of the word line thereby providing low-power program operation.

The twenty-fourth aspect of the invention provides the method of writing to a nonvolatile semiconductor memory device according to the sixteenth or eighteenth aspect, the memory cell array comprising memory cells for a plurality of pages connected to a single word line, wherein the method performs the continuous verify operation with a voltage necessary for verify operation continuously applied to the word line.

With this writing method, it is possible to perform continuous verify operation on a plurality of pages connected to a single word line with a verify voltage continuously applied to a word line. This reduces the voltage rise time and fall time of the word line in verify operation thus allowing high-speed verify operation. Further, it is possible to reduce the recharging/discharging count of the word line thereby providing low-power verify operation.

DETAILED DESCRIPTION OF THE PREFERRED EMBODIMENTS

Embodiments of the invention are described below referring to drawings, taking a flash memory as a representative nonvolatile semiconductor memory device. In the first place, common matters of the embodiments of the invention are described referring to FIGS. 1 through 3.

Figure 1:
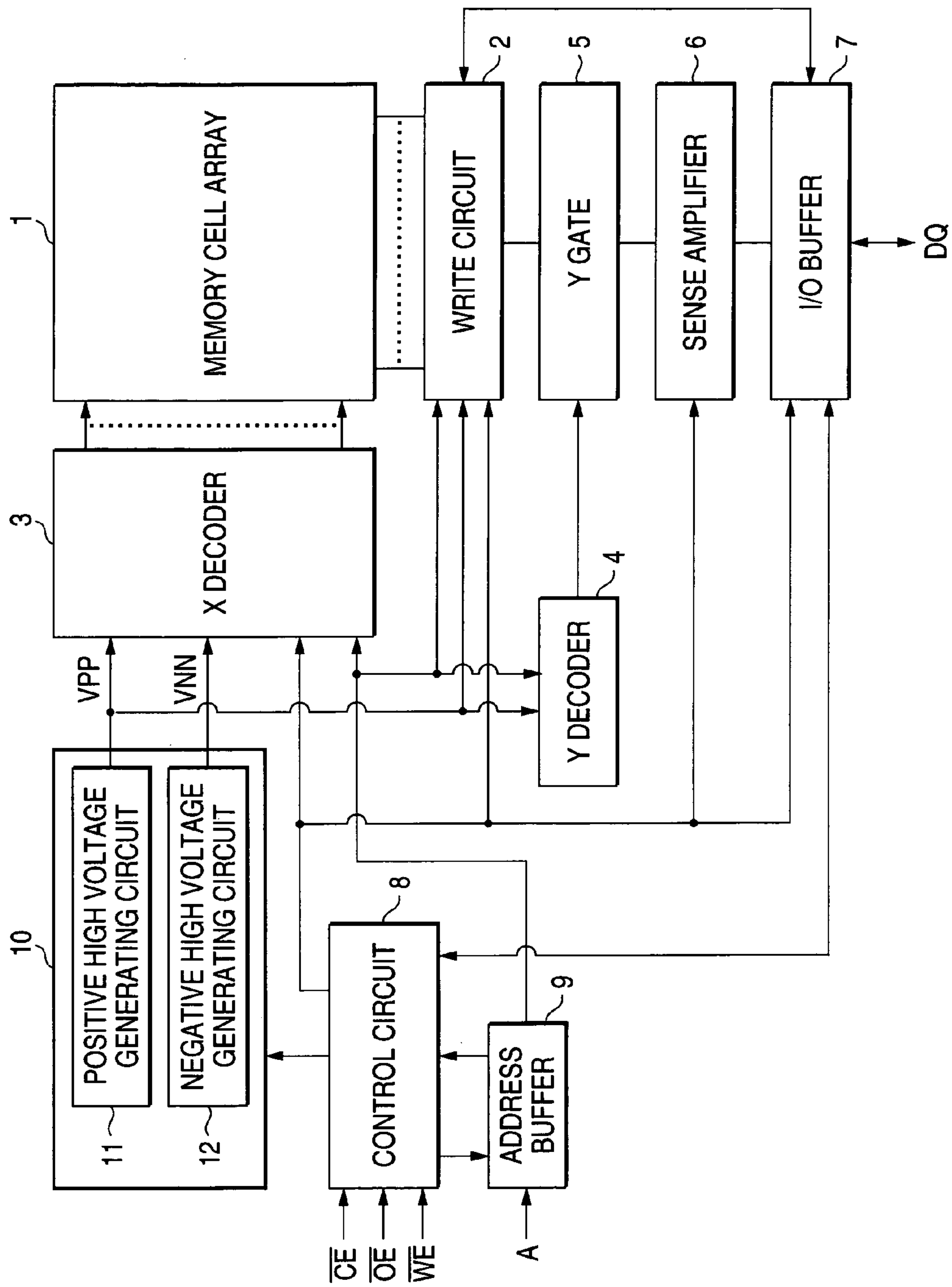
FIG. 1 shows the configuration of a flash memory (nonvolatile semiconductor memory device) according to the embodiments of the invention.

FIG. 1 shows the configuration of a flash memory (nonvolatile semiconductor memory device) according to the embodiments of the invention. In FIG. 1, a memory cell array 1 includes memory cells arranged in a matrix shape at the intersections of a plurality of word lines and a plurality of bit lines. A write circuit 2 arranged per a bit line or a plurality of bit lines performs batch write operation to a plurality of memory cells. An X decoder 3 is a circuit for selecting a predetermined word line and applying a predetermined voltage thereto. A Y decoder 4 is a circuit for selecting a predetermined Y gate from among the Y gates 5 and applying a predetermined voltage thereto. The Y gate 5 is a circuit for selecting a predetermined bit line from a plurality of bit lines and connecting the bit line to a sense amplifier 6. The sense amplifier 6 is a circuit for determining the data stored in a memory cell.

An I/O buffer 7 is a circuit for communicating data with a data input/output terminal DQ and a flash memory. In data read operation, the I/O buffer 7 outputs the output data from the sense amplifier 6 to the data input/output terminal DQ. In data write operation, the I/O buffer 7 sends the write data input from the data input/output terminal DQ to the write circuit 2. The I/O buffer 7 also sends a command input to the data input/output terminal DQ to a control circuit 8.

The control circuit 8 is a circuit for controlling the entire flash memory. The control circuit 8 performs various control such as data read, data write and data erase by controlling the write circuit 2, the X decoder 3, the Y decoder 4, the Y gate 5, the sense amplifier 6, the I/O buffer 7, an address buffer 9, and a power supply circuit 10. To the control circuit 8 are input a chip enable signal/CE, an output enable signal/OE, a write enable signal/WE which are externally input, a command input to the address terminal A and output from the address buffer 9 and a command input to the data input/output terminal DQ and output from the I/O buffer 7. The control circuit 8 interprets an externally input command to execute various operations of the flash memory.

The address buffer 9 decodes an address input to the address terminal A and sends a signal to select a predetermined write circuit, word line and bit line to the write circuit 1, the X decoder 3, and the Y decoder 4. The address buffer also sends a command input to the address terminal A to the control circuit 8.

The power supply circuit 10 is a circuit for generating a high voltage necessary for data write and erase operations. The power supply circuit 10 comprises a positive high-voltage generating circuit 11 for generating a positive high voltage VPP and a negative high voltage generating circuit 12 for generating a negative high voltage VNN.

Figure 2:
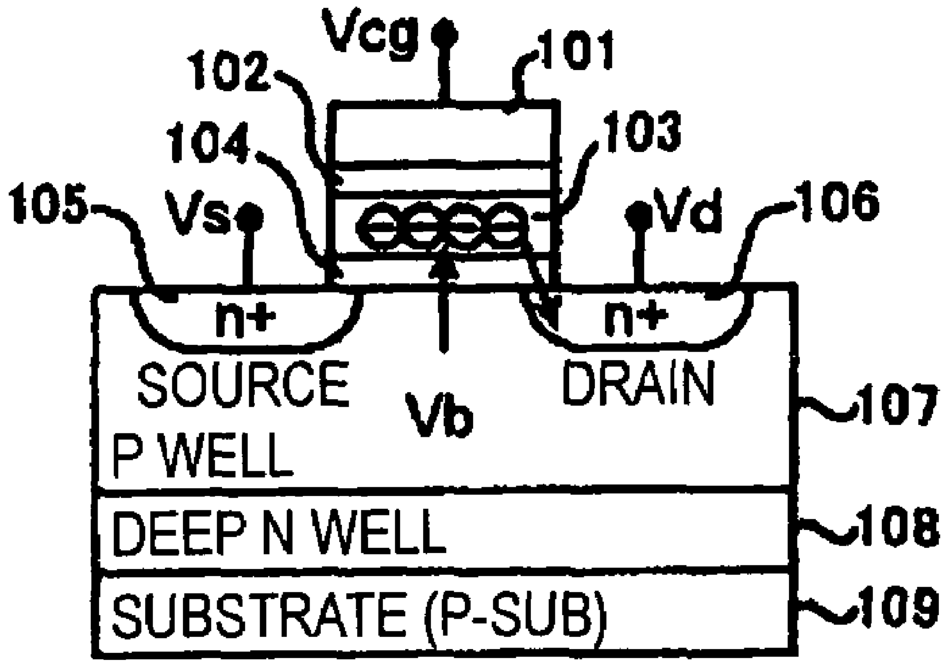
FIG. 2 is a sectional view of a memory cell used in a flash memory (nonvolatile semiconductor memory device) according to the embodiments of the invention.

FIG. 2 is a sectional view of a memory cell used in a flash memory (nonvolatile semiconductor memory device) according to the embodiments of the invention. As shown in FIG. 2, a deep N well 108 and a P well 107 are formed on a substrate 109. In the P well 107 are formed a source 105 and a drain 106 of an N-type region. On the tunnel oxide film 104 is formed a floating gate 103. Further, a control gate 101 is formed via an ONO (Oxide-Nitrogen-Oxide) film 102. A flash memory according to the embodiments of the invention applies a high electric field to the tunnel oxide film 104 to generate a tunnel current and extracts or injects electrons from/to the floating gate 103 to control the threshold voltage of the memory cells thereby performing data write and erase operations.

Figure 3:
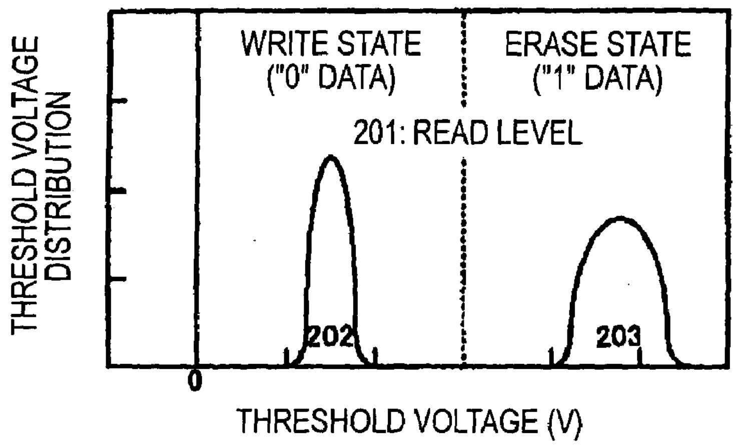
FIG. 3 shows the distribution of the threshold of a memory cell used in a flash memory (nonvolatile semiconductor memory device) according to the embodiments of the invention.

FIG. 3 shows the distribution of the threshold of a memory cell used in a flash memory (nonvolatile semiconductor memory device) according to the embodiments of the invention. In FIG. 3, a state where the threshold voltage is lower than a read level 201 is assumed as a write state (distribution 202) and a state where the threshold voltage is higher than the read level 201 is assumed as an erase state (distribution 203). Hereinafter, the data in the write state is explained as "0" data and the data in the erase state is explained as "1" data.

Memory cell write operation is performed by placing the source 105 in the open state and applying for example a voltage of −8 V to the control gate 101, for example 5 V to the drain 106, and for example a voltage of ground potential (0 V) to the well 107, thereby extracting electrons accumulated in the floating gate 103 into the drain 106. The threshold voltage after data write is lower than the read level 201 so that a current flows through the memory cells in read operation.

Memory cell erase operation is performed by placing the drain 106 in the open state and applying for example a voltage of 5 V to the control gate 101, for example −8 V to the source 105 and well 107 respectively, thereby injecting electrons into the floating gate 103 from the source 105 and well 107. The threshold voltage after data erase is set higher than the read level 201 so that a current does not flow through the memory cells in read operation.

Memory cell read operation is performed by applying a read voltage to the control gate 101, setting the source 105 and well 107 to the ground potential (0 V) and determining on a sense amplifier whether a current flows when a voltage of about 1 V is applied to the drain 106, thereby reading data from the memory cell. In case a current flows through the memory cell, the write state (0 data) is assumed; otherwise the erase state (1 data) is assumed; then read data is output.

(First Embodiment)

A flash memory (nonvolatile semiconductor memory device) according to a first embodiment of the invention is detailed below referring to FIGS. 4 through 7.

Figure 4:
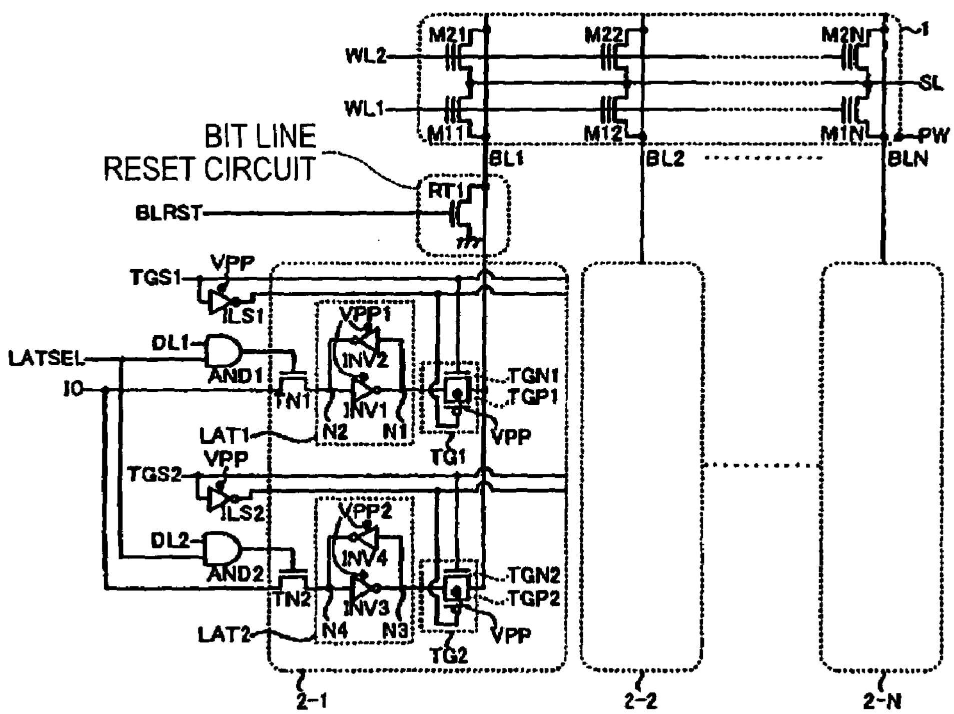
FIG. 4 shows the configuration of the memory cell array and the write circuit of a flash memory (nonvolatile semiconductor memory device) according to the first embodiment of the invention.
Figure 13:
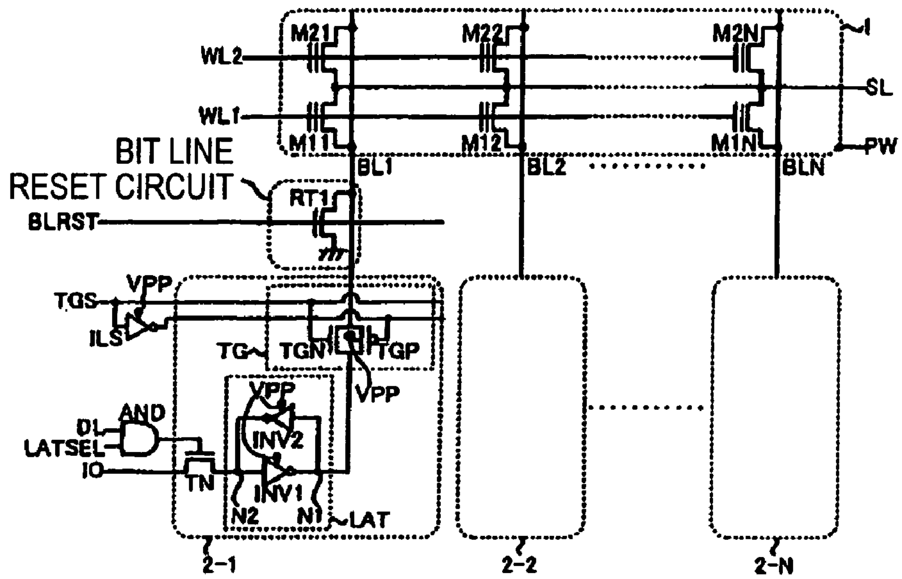
FIG. 13 shows the configuration of the memory cell array and write circuit of a related art flash memory (nonvolatile semiconductor memory device)
Figure 14:
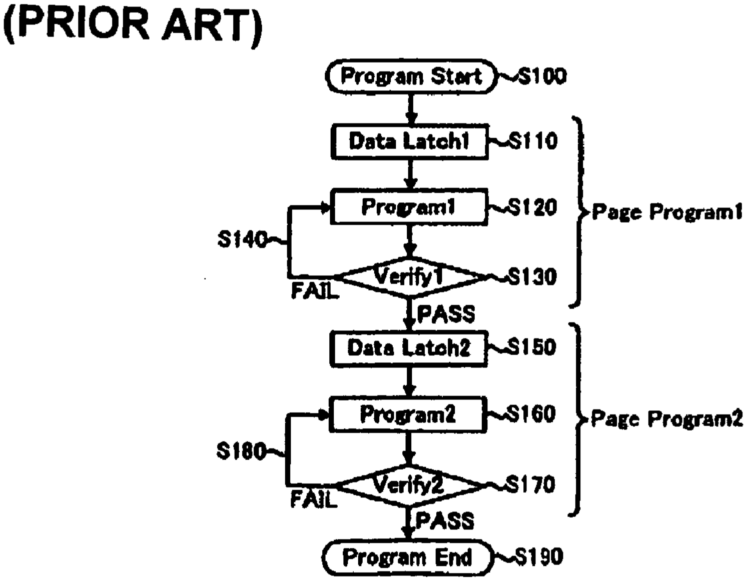
FIG. 14 is a flowchart explaining the write operation of a related art flash memory (nonvolatile semiconductor memory device)
Figure 15:
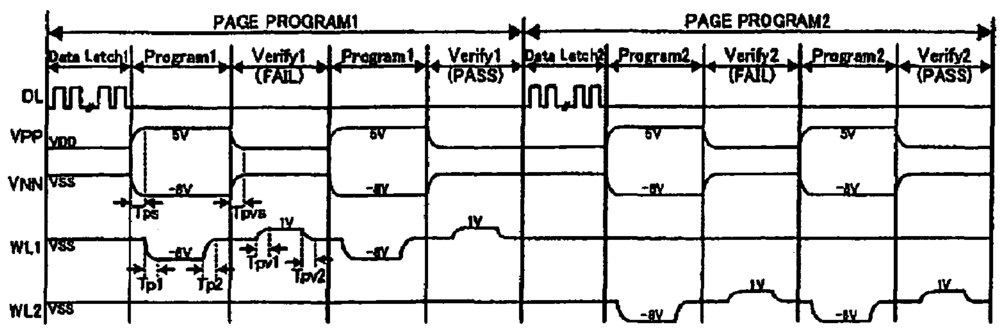
FIG. 15 is a timing chart explaining the write operation of a related art flash memory (nonvolatile semiconductor memory device)
Figure 16:
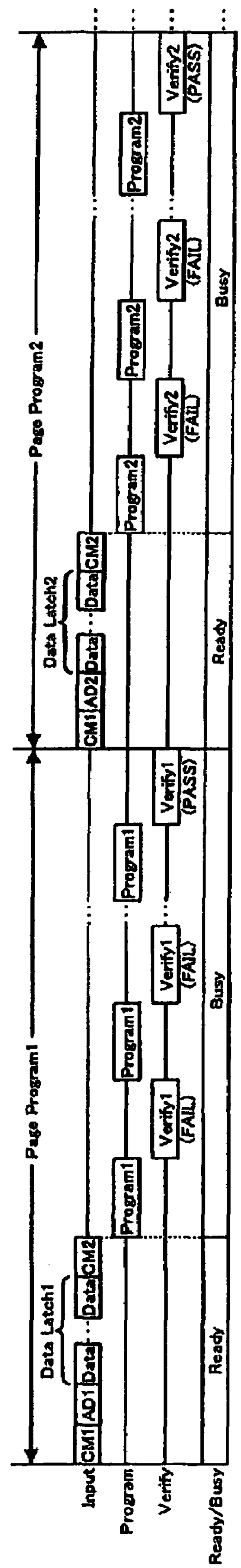
FIG. 16 shows the write command and the internal operation state of a related art flash memory (nonvolatile semiconductor memory device).

FIG. 4 shows the configuration of the memory cell array and the write circuit of a flash memory (nonvolatile semiconductor memory device) according to the first embodiment of the invention. In FIG. 4, the configuration of the memory array 1 and the bit line reset circuit is the same as that of the related art flash memory shown in FIG. 13, so that the corresponding detailed description is omitted.

The difference between the flash memory according to the first embodiment of the invention and the related art flash memory is that the configuration of the write circuits 2-1 through 2-N is different. The configuration of the flash memory according to the first embodiment of the invention is described below taking as an example the write circuit 2-1 connected to the bit line BL1.

The write circuit 2-1 comprises a first latch circuit LAT1 including inverters INV1 and INV2, a first transfer gate TG1 including an N-channel transistor TGN1 and a P-channel transistor TGP1, a first latch data storage switch TN1 including an N-channel transistor, a second latch circuit LAT2 including inverters INV3 and INV4, a second transfer gate TG2 including an N-channel transistor TGN2 and a P-channel transistor TGP2, and a second latch data storage switch TN2 including an N-channel transistor.

The first latch circuit LAT1 is a circuit for temporarily latching write data. A high voltage VPP1 is supplied to the power supply for the inverters INV1 and INV2.

The first transfer gate TG1 is a switch for connecting or interrupting the output N1 of the latch circuit LAT1 and the bit line BL1 and is controlled by a first transfer gate control signal TGS1. The first transfer gate control signal TGS1 is connected to the gate of the N-channel transistor TGN1. The output signal of the inverter ILS1 to which the transfer gate control signal TGS1 is input is connected to the gate of the P-channel transistor TGP1. To the power supply for the inverter ILS1 and the substrate of the P-channel transistor TGP1 is supplied a high voltage VPP.

The first latch data storage switch TN1 is a switch for connecting or interrupting external input data IO and the input N2 of the first latch circuit LAT1. The output signal of an AND logical element AND1 to which a first data latch control signal DL1 and a latch selection signal LATSEL are input is connected to the gate of the first latch data storage switch TN1. When write data is stored into a predetermined latch circuit, both the first data latch control signal DL1 and the latch selection signal LATSEL are driven HIGH to open the first latch data storage switch TN1 thereby setting external input data IO to the first latch circuit LAT1. When program data (0 data) is stored, the output N1 of the first latch circuit LAT1 is set to HIGH. When erase data (1 data) is stored, the output N1 of the first latch circuit LAT1 is set to LOW. After the data is stored, the first latch data storage switch TN1 closes to retain write data in the first latch circuit LAT1.

The second latch circuit LAT2 is a circuit for temporarily latching write data. A high voltage VPP2 is supplied to the power supply for the inverters INV3 and INV4.

The second transfer gate TG2 is a switch for connecting or interrupting the output N3 of the second circuit LAT2 and the bit line BL1 and is controlled by a second transfer gate control signal TGS2. The second transfer gate control signal TGS2 is connected to the gate of the N-channel transistor TGN2. The output signal of the inverter ILS2 to which the transfer gate control signal TGS2 is input is connected to the gate of the P-channel transistor TGP2. To the power supply for the inverter ILS2 and the substrate of the P-channel transistor TGP2 is supplied a high voltage VPP.

The second latch data storage switch TN2 is a switch for connecting or interrupting external input data IO and the input N4 of the second latch circuit LAT2. The output signal of an AND logical element AND2 to which a second data latch control signal DL2 and a latch selection signal LATSEL are input is connected to the gate of the second latch data storage switch TN2. When write data is stored into a predetermined latch circuit, both the second data latch control signal DL2 and the latch selection signal LATSEL are driven HIGH to open the second latch data storage switch TN2 thereby setting external input data IO to the second latch circuit LAT2. When program data (0 data) is stored, the output N3 of the second latch circuit LAT2 is set to HIGH. When erase data (1 data) is stored, the output N3 of the second latch circuit LAT2 is set to LOW. After the data is stored, the second latch data storage switch TN2 closes to retain write data in the second latch circuit LAT2.

While the configuration of the write circuit 2-1 connected to the bit line BL1 has been described, a similar circuit is connected to the write circuits 2-2 through 2-N connected to the bit lines BL2 through BLN.

As mentioned hereinabove, the flash memory according to the first embodiment of the invention comprises a plurality of latch circuits (first latch circuit LAT1 and second latch circuit LAT2) used by a write circuit arranged per a bit line to store data written to a plurality of pages and bit line connection circuits (first transfer gate TG1, second transfer gate TG2) for connecting a plurality of latch circuits and bit lines.

Write operation of the write circuit thus configured is described below.

Figure 5:
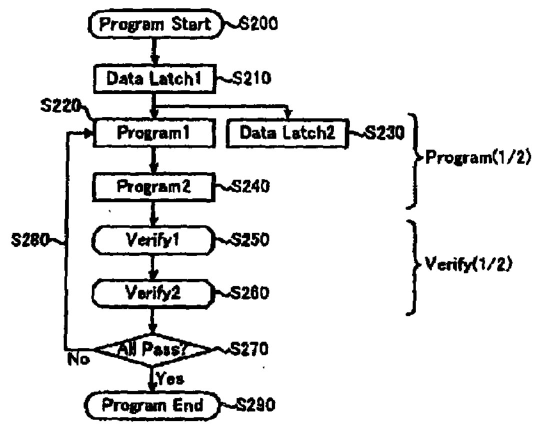
FIG. 5 is a flowchart explaining the write operation of a flash memory (nonvolatile semiconductor memory device) according to the first embodiment of the invention.
Figure 6:
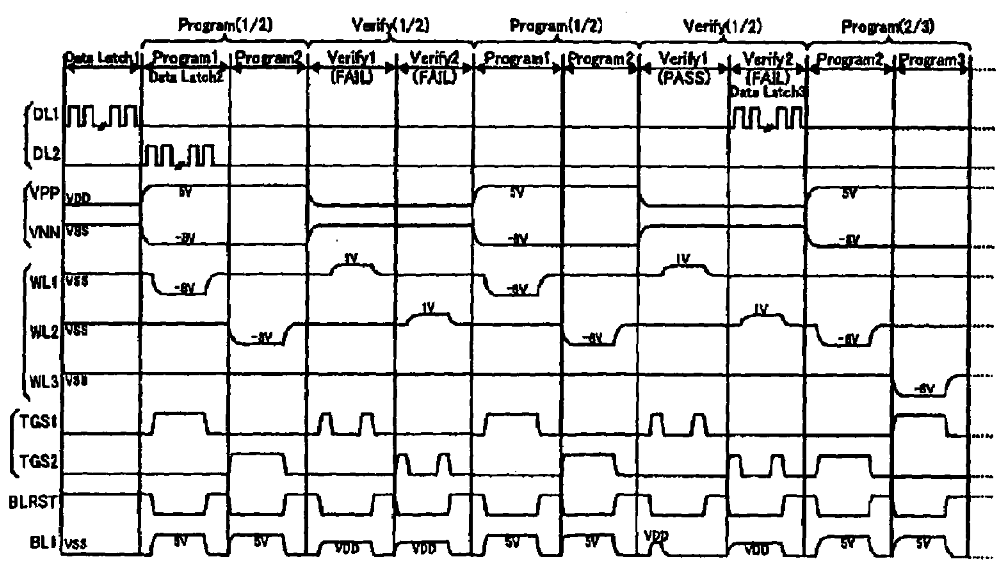
FIG. 6 is a timing chart explaining the write operation of a flash memory (nonvolatile semiconductor memory device) according to the first embodiment of the invention.

FIG. 5 is a flowchart explaining the write operation of a flash memory (nonvolatile semiconductor memory device) according to the first embodiment of the invention. The flowchart shows a case where write operation is performed to the memory cell for Page 1 connected to the word line WL1 and the memory cell for Page 2 connected to the word line WL2.

First, input of a program command starts the write operation (step S200). To perform Page 1 write operation Page 1 write data is stored into the latch circuit LAT (step S210). After data latch is complete, Page 1 program operation is performed (step S220). In parallel with Page 1 program operation, Page 2 write data is stored into the second latch circuit LAT2 to perform Page 2 write operation (step S230). After Page 1 program operation, Page 2 program operation is performed without Page 1 verify operation being performed (step S240). After Page 2 program operation is complete, Page 1 verify operation is performed (step S250). After Page 1 verify operation is complete, Page 2 verify operation is performed (step S260). In case both verify operations on Page 1 and Page 2 have failed, program operations and verify operations on Page 1 and Page 2 are performed again (step S280). A plurality of program operations and verify operations are performed, and in case verify operations on Page 1 and Page 2 have been passed, the write operation is complete (step S290).

As mentioned hereinabove, the flash memory according to the first embodiment of the invention performs latch operation on the other pages while writing to a selected page. The flash memory performs write operation to a plurality of pages by repeating continuous program operation which continuously performs program operation on a plurality of pages and continuous verify operation which continuously performs verify operation on a plurality of pages.

In case data written to Page 1 (Page 2) contains no program data (0 data), write operation is not required. Thus, only Page 2 (Page 1) write operation may be performed without Page 1 (Page 2) write operation being performed. In case Page 1 (Page 2) verify operation has been passed, the subsequent write operation is not required so that only Page 2 (Page 1) write operation may be performed without Page 1 (Page 2) write operation being performed in the subsequent write operation.

In this way, by performing write operation to next page without performing write operation to a page where write data contains no program data or a page where write operation is complete, useless program operation and verify operation are skipped thus allowing high-speed data write operation.

The timing chart shows the operation waveforms of a first data latch control signal DL1, a second data latch control signal DL2, the output voltage VPP of a positive high voltage generating circuit 11, the output voltage VNN of a negative high voltage generating circuit 12, and word lines WL1 through WL3 (WL3 is not shown in FIG. 4), a first transfer gate control signal TGS1, a second transfer gate control signal TGS2, a bit line reset control signal BLRST, and a bit line BL1.

To start Page 1 write operation, in the first place, data latch to the first latch circuit LAT1 is performed by way of the first data latch control signal DL1 (Data Latch1). In the data latch period, the word lines WL1 through WL3, the source line SL, and the well line PW are set to the ground potential. The first transfer gate TG1 and the second transfer gate TG2 are in the inactive state while the bit line reset circuit is in the active state and the bit line is set to the ground potential.

After data latch is over, the system makes a transition to the program mode. The positive high voltage generating circuit 11 and the negative high voltage generating circuit 12 respectively generate high voltages of 5 V (VPP) and −8 V (VNN) necessary for program operation. In this practice, the power supply VPP1 for the inverters INV1 and INV2 of the first latch circuit LAT1 is also set to a high voltage VPP. Once the output voltages VPP, VNN of the positive high voltage generating circuit 11 and the negative high voltage generating circuit 12 have reached predetermined voltages, the word line WL1 is set to −8 V, the source line SL is placed in the high impedance state, the bit line reset circuit in the inactive state, and the first transfer gate TG1 in the active state, then the output N1 of the first latch circuit LAT1 is connected to the bit lines. This starts program operation (Program1). In case program data (0 data) is stored in the latch circuit LAT, the output N1 of the first latch circuit LAT1 is set to HIGH so that a positive high voltage of 5 V is applied to the bit lines. In case erase data (1 data) is stored in the first latch circuit LAT1, the output N1 of the first latch circuit LAT1 is set to LOW so that a ground potential (0 v) is applied to the bit lines.

In parallel with Page 1 program operation, Page 2 write data is stored into the second latch circuit LAT2 by way of the second latch control signal DL1 (Data Latch2). While Page 2 write data is being stored into the second latch circuit LAT2, the power supply VPP 2 for the inverters INV 3 and INV4 of the second latch circuit LAT2 is a power supply voltage VDD. After data latch is over, the power VPP2 is set to a high voltage VPP.

In this way, data written to next page is set during write operation to a selected page thus reducing the data latch time, which allows high-speed data write operation.

After the program is executed for a predetermined period, the word lines WL1, WL2 and the source line SAL are set to a ground potential, the first transfer gate TG1 is placed in the inactive state ad the bit line reset circuit in the active state thus setting the bit lines to the ground potential. This completes Page 1 program operation.

Then Page 2 program operation is performed while the positive high voltage generating circuit 11 and the negative high voltage generating circuit 12 are continuously operated with high voltages VPP, VNN being continuously generated (Program2). The high voltages VPP, VNN have already generated voltages necessary for program operation so that it is possible to perform Page 2 program operation without waiting for the output stabilization wait time of the high voltage generating circuit to elapse.

The word line WL2 for Page 2 is set to −8 V, the source line SL is placed in the high impedance state, the bit line reset circuit in the inactive state, and the second transfer gate TG2 in the active state, then the output N3 of the second latch circuit LAT2 is connected to the bit lines. This starts Page 2 program operation. In case program data (0 data) is stored in the second latch circuit LAT2, the output N3 of the second latch circuit LAT2 is set to HIGH so that a positive high voltage of 5 V is applied to the bit lines. In case erase data (1 data) is stored in the second latch circuit LAT2, the output N3 of the second latch circuit LAT2 is set to LOW so that a ground potential (0 v) is applied to the bit lines.

After the program is executed for a predetermined period, the word line WL2 and the source line SL are set to a ground potential, the second transfer gate TG2 is placed in the inactive state and the bit line reset circuit in the active state, then the bit lines are set to the ground potential. This completes Page 2 program operation.

In this way, Page 2 program operation is performed while the positive high voltage generating circuit 11 and the negative high voltage generating circuit 12 are continuously operated with high voltages VPP, VNN being continuously generated. It is thus possible to perform Page 2 program operation without waiting for the output stabilization wait time of the high voltage generating circuit to elapse. As a result, high-speed data write operation is allowed.

Next, Page 1 verify operation is performed (Verify1). The system makes a transition to the verify mode. The positive high voltage generating circuit 11 and the negative high voltage generating circuit 12 respectively generate power supply voltage VDD (VPP) and the voltage of the ground potential VSS (VNN). The power supply voltage VDD is fed to the power supply VPP1 for the first latch circuit LAT1 and the power supply VPP2 for the second latch circuit LAT2. Once the output voltages VPP, VNN of the positive high voltage generating circuit 11 and the negative high voltage generating circuit 12 have reached predetermined voltages, the bit line reset circuit is placed in the inactive state and the first transfer gate TG1 in the active state, then only the bit lines corresponding to program data (output N1 of the first latch circuit LAT1 is HIGH) are pre-charged to the power supply voltage VDD. When bit line pre-charging is over, the first transfer gate TG1 is placed in the inactive state and the first latch circuit LAT1 is isolated from bit lines and a voltage of 1 V is applied to the word line WL1.

In case the threshold voltage of the memory cells is less than 1 V, that is, in case the memory cells are properly programmed, the bit lines are discharged via the memory cells and the potential of the bit lines decreases toward the ground potential. In case the threshold voltage of the memory cells is 1 V or more, that is, in case the memory cells are not properly programmed, the bit lines are not discharged via the memory cells and the potential of the bit lines is maintained at the power supply voltage VDD.

After a predetermined period has elapsed, the first transfer gate TG1 is placed in the active state again and the first latch circuit LAT1 is connected to the bit lines. In case the threshold voltage of the memory cells is less than 1 V, that is, in case the memory cells are properly programmed, the output N1 of the first latch circuit LAT1 is driven LOW (erase data), and the subsequent program is not executed. In case the threshold voltage of the memory cells is 1 V or more, that is, in case the memory cells are not properly programmed, the output N1 of the first latch circuit LAT1 is maintained at the first set data, and the program is executed again in the subsequent program operation.

After a predetermined period has elapsed, Page 1 verify operation is terminated by setting the word line WL1 to the ground potential, placing the first transfer gate TG1 in the inactive state and the bit line reset circuit in the active state to set the bit lines to the ground potential.

Next, the positive high voltage generating circuit 11 and the negative high voltage generating circuit 12 are continuously operated and Page 2 verify operation is performed with voltages VPP, VNN being continuously generated (Verify2). The high voltages VPP, VNN have already generated voltages necessary for verify operation so that it is possible to perform Page 2 verify operation without waiting for the output stabilization wait time of the high voltage generating circuit to elapse.

The bit line reset circuit is placed in the inactive state and the second transfer gate TG2 in the active state, then only the bit lines corresponding to program data (output N3 of the second latch circuit LAT2 is HIGH) are pre-charged to the power supply voltage VDD. When bit line pre-charging is over, the second transfer gate TG2 is placed in the inactive state and the second latch circuit LAT2 is isolated from bit lines and a voltage of 1 V is applied to the word line WL2.

In case the threshold voltage of the memory cells is less than 1 V, that is, in case the memory cells are properly programmed, the bit lines are discharged via the memory cells and the potential of the bit lines decreases toward the ground potential. In case the threshold voltage of the memory cells is 1 V or more, that is, in case the memory cells are not properly programmed, the bit lines are not discharged via the memory cells and the potential of the bit lines is maintained at the power supply voltage VDD.

After a predetermined period has elapsed, the second transfer gate TG2 is placed in the active state again and the second latch circuit LAT2 is connected to the bit lines. In case the threshold voltage of the memory cells is less than 1 V, that is, in case the memory cells are properly programmed, the output N3 of the second latch circuit LAT2 is driven LOW (erase data), and the subsequent program is not executed. In case the threshold voltage of the memory cells is 1 V or more, that is, in case the memory cells are not properly programmed, the output N3 of the second latch circuit LAT2 is maintained at the first set data, and the program is executed again in the subsequent program operation.

After a predetermined period has elapsed, Page 2 verify operation is terminated by setting the word line WL2 to the ground potential, placing the second transfer gate TG2 in the inactive state and the bit line reset circuit in the active state to set the bit lines to the ground potential.

In this way, Page 2 verify operation is performed while the positive high voltage generating circuit 11 and the negative high voltage generating circuit 12 are continuously operated with high voltages VPP, VNN being continuously generated. It is thus possible to perform Page 2 verify operation without waiting for the output stabilization wait time of the high voltage generating circuit to elapse. As a result, high-speed data write operation is allowed.

In case both verify operations on Page 1 and Page 2 have failed, continuous program operation and continuous verify operation on Page 1 and Page 2 are performed. Assume that the subsequent Page 1 verify operation has been passed. Next, Page 2 verify operation is performed, and in parallel with Page 2 verify operation, Page 3 write data is stored by way of a first data latch control signal DL1 into the first latch circuit LAT1 where write operation is complete (Data Latch3). In case Page 2 verify operation have failed, write operation is performed by way of continuous program operation and continuous verify operation on Page 1 and Page 2.

In this way, in case verify operation on a selected page has been passed, data written to next page is set to the latch circuit for a page where write operation is complete during write operation to the next page. This reduces the data latch time, thus allowing high-speed data write operation.

Figure 7A:
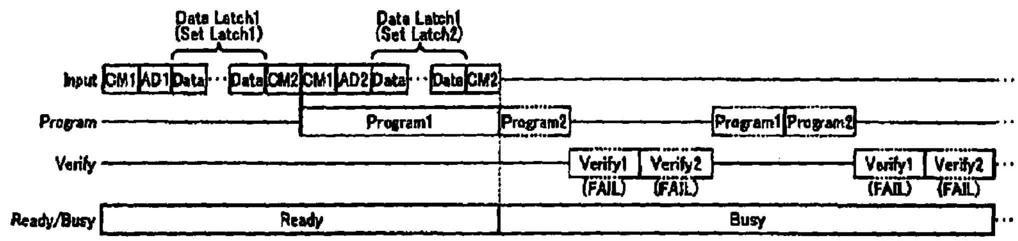
FIGS. 7A–7C illustrate the write command and the internal operation state of a flash memory (nonvolatile semiconductor memory device) according to the first embodiment of the invention.

FIG. 7 shows the write command and the internal operation state of a flash memory (nonvolatile semiconductor memory device) according to the first embodiment of the invention. As shown in FIG. 7A, in the first place, a program command CM1 and the program address AD1 of Page 1 are input, then Page 1 write data is input to store these data into the first latch circuit LAT1. By inputting a program command CM2 after input of write data, Page 1 write operation starts. The system is in the ready state also during Page 1 program operation. In parallel with Page 1 program operation, the program command CM1 and the program address AD2 of Page 2 are input, then Page 2 write data is input to store these data into the second latch circuit LAT2. By inputting a program command CM2 after input of write data, the system enters the busy state.

After Page 1 program operation is complete, Page 2 program operation starts with the output voltage of the high voltage generating circuit being continuously generated. After Page 2 program operation is complete, continuous verify operation on Page 1 and Page 2 is performed. In case continuous verify operation on Page 1 and Page 2 has failed, continuous program operation and continuous verify operation on Page 1 and Page 2 are performed again.

Figure 7B:
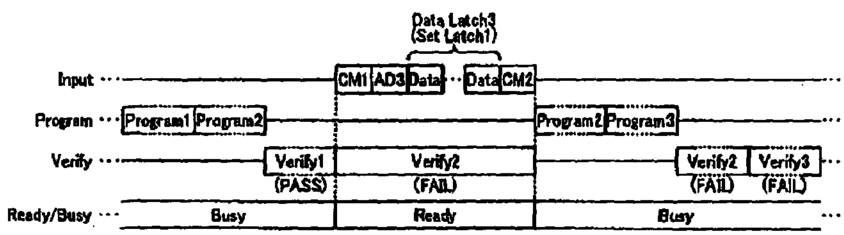

As shown in FIG. 7B, assume that continuous program operation and continuous verify operation on Page 1 and Page 2 are repeated and Page 1 verify operation is passed. Next, Page 2 verify operation is performed, when the system enters the ready state. In parallel with Page 2 verify operation, the program command CM1 and the program address AD3 of Page 3 are input, then Page 3 write data is input to store these data into the first latch circuit LAT1. By inputting a program command CM2 after input of write data, the system enters the busy state. In case Page 2 verify operation has failed, write operation is subsequently performed by way of continuous program operation and continuous very operation on Page 2 and Page 3.

Figure 7C:
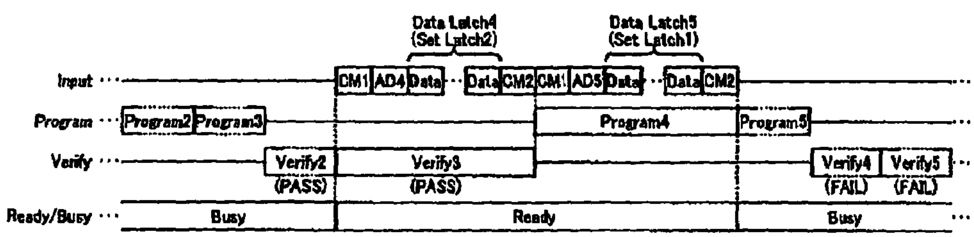

As shown in FIG. 7*c*, assume that continuous program operation and continuous verify operation on Page 2 and Page 3 are repeated and Page 2 verify operation is passed. Next, Page 3 verify operation is performed, when the system enters the ready state. In parallel with Page 3 verify operation, the program command CM1 and the program address AD4 of Page 4 are input, then Page 4 write data is input to store these data into the second latch circuit LAT2. After the write data is input, the program command CM2 is input.

Assume that Page 3 verify operation is also passed. Next, Page 4 verify operation is performed, when the system is in the ready state. In parallel with Page 4 verify operation, the program command CM1 and the program address AD5 of Page 5 are input, then Page 5 write data is input to store these data into the first latch circuit LAT1. By inputting a program command CM2 after input of write data, the system enters the busy state. After Page 4 program operation is complete, Page 5 program operation is subsequently performed. Then continuous verify operation on Page 4 and page 5 is performed.

A flash memory according to the first embodiment of the invention comprises a plurality of latch circuits used by write circuits arranged per a bit line to store data written to a plurality of pages and bit line connection circuits for connecting the plurality of latch circuits and bit lines. The flash memory performs write operation to a plurality of pages by repeating continuous program operation which sequentially selects data written to a plurality of pages stored in the plurality of latch circuits while continuously operating a voltage generating circuit to cause the circuit to continuously generate a voltage necessary for program operation thereby continuously performing program operation on a plurality of pages, and continuous verify operation which sequentially selects data written to a plurality of pages stored in the plurality of latch circuits while continuously operating the voltage generating circuit to cause the circuit to continuously generate a voltage necessary for verify operation thereby continuously performing verify operation on a plurality of pages. It is thus possible to reduce the program voltage output stabilization wait time and the verify voltage output stabilization wait time of the voltage generating circuit, thereby allowing high-speed data write operation. Further, write operation to next page is allowed by simply switching between bit line connection circuits, which ensures high-speed data write operation.

Write data is set to the latch circuits other than that for a selected page during program operation or verify operation of write data stored in the latch circuit for the selected page. This reduces the data latch time thus allowing high-speed data write operation.

In case it has been detected that the memory cells for a selected page are properly programmed in the verify operation on the selected page, data written to a new page is set to the latch circuit for a page where the write operation is complete during the subsequent program operation or verify operation on the next page. This reduces the data latch time thus allowing high-speed data write operation.

In case write data stored in the latch circuit for a selected page contains no program data, program operation and verify operation on the next page is performed without those operations on the selected page being performed. As a result, useless program operation and verify operation are skipped thus allowing high-speed data write operation.

(Second Embodiment)

A flash memory (nonvolatile semiconductor memory device) according to the second embodiment of the invention is detailed below referring to FIG. 8.

Figure 8:
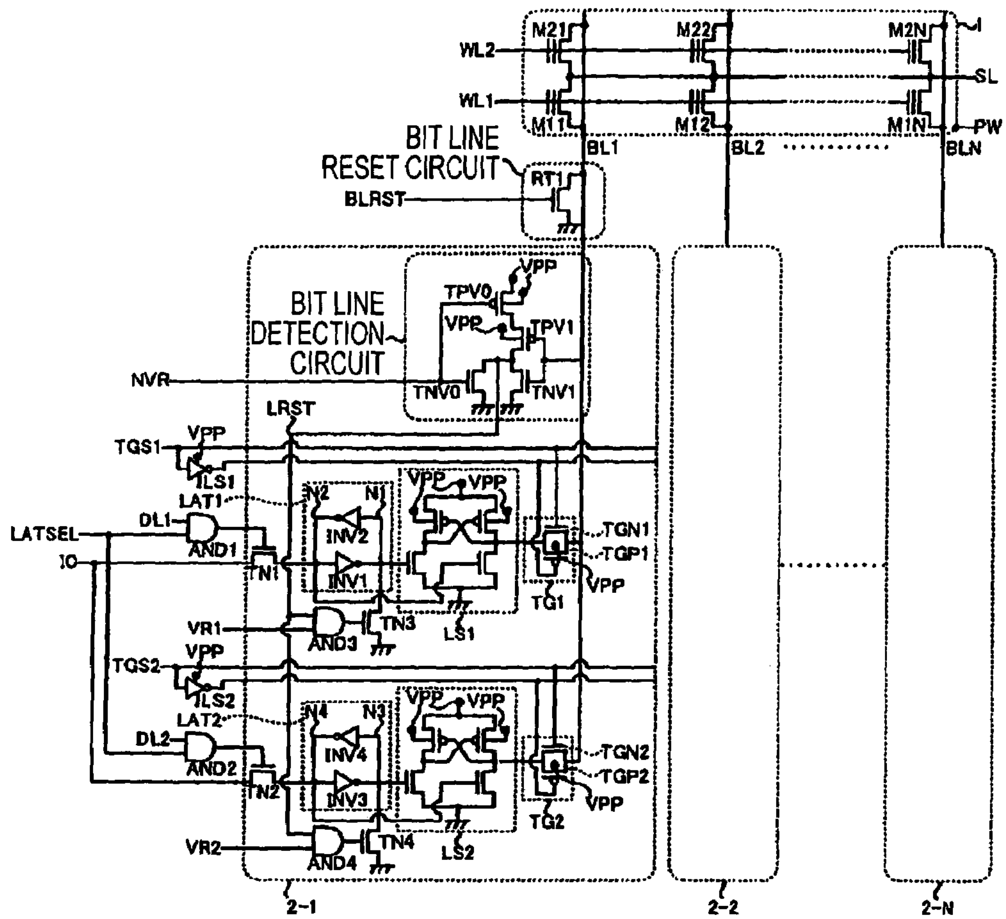
FIG. 8 shows the configuration of the memory cell array and the write circuit of a flash memory (nonvolatile semiconductor memory device) according to the second embodiment of the invention.

FIG. 8 shows the configuration of the memory cell array and the write circuit of a flash memory (nonvolatile semiconductor memory device) according to the second embodiment of the invention. Same signs and numerals are assigned to the components in FIG. 8 having the same functions as those in the first embodiment and the corresponding details are omitted. Only sections having different configurations are described below.

The difference between FIG. 8 and FIG. 4 shown in the first embodiment is that the configuration of the write circuits 2-1 through 2-N is different. Taking as an example the write circuit 2-1 connected to the bit line BL1, the write circuit 2-1 comprises a level shift circuit LS1 powered with a high voltage VPP inserted between a first latch circuit LAT 1 and a first transfer gate TG1. The power supply for the inverters INV1 and INV2 comprising the first latch circuit LAT1 is a power supply voltage VDD. Similarly, a level shift circuit LS2 powered with a high voltage VPP is inserted between a second latch circuit LAT2 and a second transfer gate TG2. The power supply for the inverters INV3 and INV4 comprising the second latch circuit LAT2 is a power supply voltage VDD.

The high voltage VPP changes into a 5 V and a power supply voltage of VDD by way of program operation and verify operation. In the first embodiment, the power supply for latch circuits is a high voltage VPP so that retention of write data in the latch circuits could be unstable. In the second embodiment, the power supply for a latch circuit is constantly a power supply voltage VDD so that the latch circuit can retain write data in a stable fashion. Further, in case data latch is made during program operation, it is necessary to set the power supply for the latch circuit to be data-latched to the power supply voltage VDD. In the second embodiment, the power supply for a latch circuit is constantly a power supply voltage VDD so that it is possible to perform data latch during program operation thus allowing easy operation control.

Further, a latch data reset mechanism is different between FIG. 8 and FIG. 4. To the bit line BL1 is connected a bit line detection circuit comprising transistors TNV0, TNV1, TPV0, TPV1. The bit line detection circuit forms the NOR logic. The bit line detection circuit includes two terminals connected to the bit line BL1 and a verify operation signal NVR.

A latch reset signal LRST as an output of the bit line detection circuit is input to the input terminals of the AND logical elements AND3 and AND4. To the input terminal of the AND logical element AND 3 is input the latch reset signal LRST and a first latch verify signal VR1. The output terminal of the AND logical element AND 3 is connected to the gate of a first latch reset transistor TN3. When both the latch reset signal LRST and the first latch verify signal VR1 are HIGH, the first latch reset transistor TN3 is placed in the active state to reset the output terminal N1 of the first latch circuit LAT1 LOW (erase data).

Similarly, to the input terminal of the AND logical element AND 4 is input the latch reset signal LRST and a second latch verify signal VR2. The output terminal of the AND logical element AND 4 is connected to the gate of a second latch reset transistor TN4. When both the latch reset signal LRST and the second latch verify signal VR2 are HIGH, the second latch reset transistor TN4 is placed in the active state to reset the output terminal N3 of the second latch circuit LAT2 LOW (erase data).

With this configuration, it is possible to share a bit line detection circuit among a plurality of latch circuits thus reducing the circuit scale of the write circuit. Latch data can be reset without fail by tuning the capability of the latch reset transistor. Moreover, latch data reset operation is allowed even in case a level shift circuit is inserted between the latch circuits and the bit line connection circuits.

Write operation of the write circuit thus configured is described below. Write operation by way of continuous program operation and continuous verify operation with the high voltage generating circuit continuously operating is the same as that in the first embodiment, so that the corresponding details are omitted. A latch data reset method in verify operation which operates differently from the first embodiment is detailed below.

In the verify operation of the first latch circuit LAT1, the high voltage VPP is a power supply voltage VDD. The bit reset circuit is placed in the inactive state and the first transfer gate TG1 in the active state, then only the bit lines corresponding to program data (output N1 of the first latch circuit LAT1 is HIGH) are pre-charged to the power supply voltage VDD. When bit line pre-charging is over, the first transfer gate TG1 is placed in the inactive state and the first latch circuit LAT1 is isolated from bit lines and a voltage of 1 V is applied to the word line. After that, the potential of the bit lines varies depending on the threshold voltage of memory cells.

After a predetermined period has elapsed, the verify operation signal NVR is set to LOW and the first latch verify signal VR1 is set to HIGH. In case the threshold voltage of the memory cells is less than 1 V, that is, in case the memory cells are properly programmed, the bit lines are discharged to a ground potential, so that the latch reset signal LRST is driven HIGH and the output of the AND logical element AND 3 is driven HIGH. This places the first latch reset transistor TN3 in the active state and drives the output N1 of the first latch circuit LAT1 LOW (erase data), and the subsequent program is not executed.

In case the threshold voltage of the memory cells is 1 V or more, that is, in case the memory cells are not properly programmed, the bit lines are maintained at the power supply voltage VDD, so that the latch reset signal LRST is driven LOW and the output of the AND logical element AND 3 is driven LOW. The first latch reset transistor TN3 remains inactive. The output N1 of the first latch circuit LAT1 is maintained at the first set data, and the program is executed again in the subsequent program operation.

Similarly, in the verify operation on the second latch circuit LAT2, the second latch verify signal VR2 is driven HIGH to overwrite the latch data in the second latch circuit LAT2.

In this way, the flash memory according to the second embodiment of the invention comprises a level shift circuit for converting the output voltage level of a latch circuit to a high voltage level between a plurality of latch circuits and bit line connection circuit. It is thus possible to change the voltage of the power supply for the latch circuits to a power supply voltage thus allowing stable latch retaining operation. Moreover, data latch in program operation is made easy.

Further, the flash memory according to the second embodiment of the invention comprises a detection circuit (bit line detection circuit) for detecting that memory cells are properly programmed before verify operation, a plurality of latch data reset circuits (a first latch reset transistor TN3, a second latch reset transistor TN4) capable of individually resetting latch data in a plurality of latch circuits, and latch data reset selection circuits for selecting a predetermined latch data reset circuit in order to reset latch data in a predetermined latch circuit in case the detection circuit has detected that the memory cells are properly programmed. It is thus possible to share a bit line detection circuit among a plurality of latch circuits thus reducing the circuit scale of the write circuit. Latch data can be reset without fail by tuning the capability of the latch data reset circuit. Moreover, latch data reset operation is allowed even in case a level shift circuit is inserted between the latch circuits and the bit line connection circuits.

(Third Embodiment)

A flash memory (nonvolatile semiconductor memory device) according to the third embodiment of the invention is detailed below referring to FIG. 9.

Figure 9:
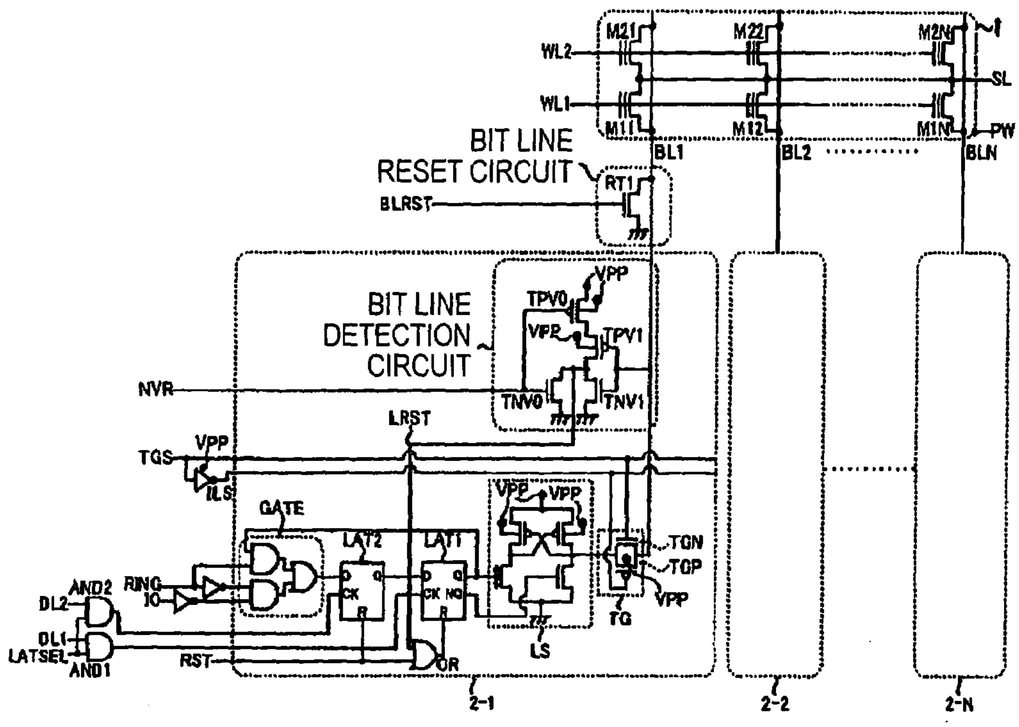
FIG. 9 shows the configuration of the memory cell array and the write circuit of a flash memory (nonvolatile semiconductor memory device) according to the third embodiment of the invention.

FIG. 9 shows the configuration of the memory cell array and the write circuit of a flash memory (nonvolatile semiconductor memory device) according to the third embodiment of the invention. Same signs and numerals are assigned to the components in FIG. 9 having the same functions as those in the first embodiment and the corresponding details are omitted. Only sections having different configurations are described below.

The difference between FIG. 9 and FIG. 4 shown in the first embodiment is that the configuration of the write circuits 2-1 through 2-N is different. Taking as an example the write circuit 2-1 connected to the bit line BL1, the write circuit 2-1 comprises a first latch circuit LAT1, a second latch circuit LAT2, a level shift circuit LS, a transfer gate TG, a bit line detection circuit, an OR logical element OR, and an AND-OR logical element GATE.

The first latch circuit LAT1 and the second latch circuit LAT2 are connected serially. The outputs Q, NQ of the first latch circuit LAT1 are connected to the level shift circuit LS powered with a high voltage VPP. The output Q of the first latch circuit LAT1 is also connected to the input terminal of the AND-OR logical element GATE. The first latch circuit LAT1 and the second latch circuit LAT2 comprise flip-flop circuits, thus data storage and latch data transfer to a plurality of latch circuits are made possible by simply inputting a clock. Thus data storage and latch data transfer to latch circuits are made easy.

The AND-OR logical element GATE is a logical element for selecting whether to input the inverted data of external input data IO or the output Q of the first latch circuit LAT1 to the input terminal D of the second latch circuit LAT2. Selection of input data is made by way of a ring shift control signal RING. When the ring shift control signal RING is LOW, the inverted data of the external input data IO is input to the input terminal D of the second latch circuit LAT2. When the ring shift control signal RING is HIGH, the output Q of the first latch circuit LAT1 is input to the input terminal D of the second latch circuit LAT2.

To the AND logical element AND1 are input a first data latch control signal DL1 and a latch selection signal LATSEL. The output terminal of the AND logical element AND1 is input to the data capture terminal CK of the first latch circuit LAT1. Data capture into the first latch circuit LAT1 is made by inputting a clock to the first data latch control signal DL1 while the latch selection signal LATSEL is HIGH.

To the AND logical element AND2 are input a second data latch control signal DL2 and the latch selection signal LATSEL. The output terminal of the AND logical element AND2 is input to the data capture terminal CK of the second latch circuit LAT2. Data capture into the second latch circuit LAT2 is made by inputting a clock to the second data latch control signal DL2 while the latch selection signal LATSEL is HIGH.

A reset signal RST is input to the reset terminal R of the second latch circuit LAT2 and an OR logical element OR. The output of the OR logical element OR is input to the reset terminal of the first latch circuit LAT1. By setting the reset signal RST HIGH, the first latch circuit LAT1 and the second latch circuit LAT2 are reset.

To the bit line BL1 is connected a bit line detection circuit comprising transistors TNV0, TNV1, TPV0, TPV1. A latch reset signal LRST as an output of the bit line detection circuit is input to the OR logical element OR. The latch reset signal LRST is driven HIGH to reset the first latch circuit LAT1. Operation of the bit line detection circuit is the same as that in the second embodiment so that the corresponding details are omitted.

Write operation of the write circuit thus configured is described below. To start Page 1 write operation, Page 1 data latch is made in the first place. The ring shift control signal RING is set to LOW, write data is input from the external input data IO, then write data is stored into the second latch circuit LAT2 by way of the second data latch control signal DL2. After Page 1 data latch is complete, Page 1 write data stored in the second latch circuit LAT2 is transferred to the first latch circuit LAT1 by way of the first data latch control signal DL1. Storing program data (0 data) drives the output Q of the latch circuit HIGH, while storing erase data (1 data) drives the output Q of the latch circuit LOW. During the data latch period, word lines WL1, WL2, a source line SL, and a well line PW are set to a ground potential. The transfer gate TG is set to the inactive state, the bit line reset circuit to the active state, and the bit lines to the ground potential.

After data latch is over, the system makes a transition to the program mode. The positive high voltage generating circuit 11 and the negative high voltage generating circuit 12 respectively generate high voltages of 5 V (VPP) and −8 V (VNN) necessary for program operation. After the output voltages VPP, VNN of the positive high voltage generating circuit 11 and the negative high voltage generating circuit 12 have reached predetermined voltages, the word line WL1 is set to −8 V, the source line SL is placed in the high impedance state, the bit line reset circuit in the inactive state, and the transfer gate TG in the active state, then the level shift circuit LS is connected to the bit lines, thus starting program operation.

In parallel with Page 1 program operation, Page 2 data latch is performed. The ring shift control signal RING is set to LOW, write data is input from the external input data IO, then write data is stored into the second latch circuit LAT2 by way of the second data latch control signal DL2.

In this way, data written to next page is set to the latch circuits other than that for a selected page during write operation to the selected page. This reduces the data latch time thus allowing high-speed data write operation.

After the program is executed for a predetermined period, the word line WL1 and the source line SL are set to a ground potential, the transfer gate TG is placed in the inactive state and the bit line reset circuit in the active state, then the bit lines are set to a ground potential. This completes Page 1 program operation. At this point in time, Page 1 write data is stored in the first latch circuit LAT1 and Page 2 write data is stored in the second latch circuit LAT2. The ring shift control signal RING is set to HIGH and latch data in the first latch circuit LAT1 and the second latch circuit LAT2 is shifted in a ring shape by way of the first data latch control signal DL1 and the second data latch control signal DL2. Then Page 2 write data is stored into the first latch circuit LAT1, and Page 1 write data is stored into the second latch circuit LAT2.

Page 2 program operation is performed while the positive high voltage generating circuit 11 and the negative high voltage generating circuit 12 are continuously operated with high voltages VPP, VNN being continuously generated. The high voltages VPP, VNN have already generated voltages necessary for program operation so that it is possible to perform Page 2 program operation without waiting for the output stabilization wait time of the high voltage generating circuit to elapse. The word line WL1 for Page 2 is set to −8 V, the source line SL is placed in the high impedance state, the bit line reset circuit in the inactive state, and the transfer gate TG in the active state, then the level shift circuit LS is connected to the bit lines, thus starting Page 2 program operation.

After the program is executed for a predetermined period, the word line WL2 and the source line SL are set to a ground potential, the transfer gate TG is placed in the inactive state and the bit line reset circuit in the active state, then the bit lines are set to a ground potential. This completes Page 2 program operation. At this point in time, Page 2 write data is stored in the first latch circuit LAT1 and Page 1 write data is stored in the second latch circuit LAT2. The ring shift control signal RING is set to HIGH and latch data in the first latch circuit LAT1 and the second latch circuit LAT2 is shifted in a ring shape by way of the first data latch control signal DL1 and the second data latch control signal DL2. Then Page 1 write data is stored into the first latch circuit LAT1, and Page 2 write data is stored into the second latch circuit LAT2. After continuous program operation is complete, write data to be stored into the first latch circuit LAT1 and the second latch circuit LAT2 returns to the initial state.

Next, continuous verify operation on Page 1 and Page 2 is performed. The system makes a transition to the verify mode. The positive high voltage generating circuit 11 and the negative high voltage generating circuit 12 respectively generate power supply voltage VDD (VPP) and the voltage of the ground potential VSS (VNN). Once the output voltages VPP, VNN of the positive high voltage generating circuit 11 and the negative high voltage generating circuit 12 have reached predetermined voltages, the bit line reset circuit is placed in the inactive state and the transfer gate TG in the active state, then only the bit lines corresponding to program data (output Q of the first latch circuit LAT1 is HIGH) are pre-charged to the power supply voltage VDD. When bit line pre-charging is over, the transfer gate TG is placed in the inactive state and the level shift circuit LS is isolated from bit lines and a voltage of 1 V is applied to the word line WL1. After that, the potential of the bit lines varies depending on the threshold voltage of memory cells.

After a predetermined period has elapsed, the verify operation signal NVR is set to LOW to activate the bit line detection circuit. In case the threshold voltage of the memory cells is less than 1 V, that is, in case the memory cells are properly programmed, the bit lines are discharged to a ground potential, so that the latch reset signal LRST is driven HIGH and the output of the OR logical element OR is driven HIGH. This resets the latch data in the first latch circuit LAT1. That is, the output Q of the first latch circuit LAT1 is driven LOW (erase data), and the subsequent program is not executed.

In case the threshold voltage of the memory cells is 1 V or more, that is, in case the memory cells are not properly programmed, the bit lines are maintained at the power supply voltage VDD, so that the latch reset signal LRST is driven LOW and the output of the OR logical element OR is driven LOW. The latch data in the first latch circuit LAT1 is maintained at the first set data, and the program is executed again in the subsequent program operation.

After a predetermined period has elapsed, the word line is set to a ground potential, the bit line reset circuit is placed in the active state and the bit lines are set to a ground potential. This completes Page 1 verify operation. At this point in time, post-verify Page 1 write data is stored in the first latch circuit LAT1 and Page 2 write data is stored in the second latch circuit LAT2. The ring shift control signal RING is set to HIGH and latch data in the first latch circuit LAT1 and the second latch circuit LAT2 is shifted in a ring shape by way of the first data latch control signal DL1 and the second data latch control signal DL2. Then Page 2 write data is stored into the first latch circuit LAT1, and post-verify Page 1 write data is stored into the second latch circuit LAT2.

Page 2 program operation is performed while the positive high voltage generating circuit 11 and the negative high voltage generating circuit 12 are continuously operated with high voltages VPP, VNN being continuously generated. The high voltages VPP, VNN have already generated voltages necessary for program operation so that it is possible to perform Page 2 verify operation without waiting for the output stabilization wait time of the high voltage generating circuit to elapse. The word line WL2 for Page 2 is selected to perform verify operation thus overwriting the data in the first latch circuit LAT1 where Page 2 data is stored. At this point in time, post-verify Page 2 write data is stored in the first latch circuit LAT1 and post-verify Page 1 write data is stored in the second latch circuit LAT2.

The ring shift control signal RING is set to HIGH and latch data in the first latch circuit LAT1 and the second latch circuit LAT2 is shifted in a ring shape by way of the first data latch control signal DL1 and the second data latch control signal DL2. Then post-verify Page 1 write data is stored into the first latch circuit LAT1, and post-verify Page 2 write data is stored into the second latch circuit LAT2. After continuous verify operation is complete, post-verify write data is stored in the first latch circuit LAT1 and the second latch circuit LAT2.

Assume that continuous program operation and continuous verify operation on Page land Page 2 are repeated and the Page 1 verify operation has been passed. Latch data is shifted in a ring shape then Page 2 verify operation is performed. In parallel with the Page 2 verify operation, Page 2 write data is stored into the second latch circuit LAT2 where write operation is complete, by way of the second data latch control signal DL2. In case Page 2 verify operation has failed, write operation is performed by way of continuous program operation and continuous verify operation on Page 2 and Page 3.

As mentioned hereinabove, the flash memory according to the third embodiment of the invention comprises a serial connection latch group where a plurality of latch circuits are connected serially, the group used by write circuits arranged per a bit line to store data written to a plurality of pages and bit line connection circuits for connecting the latch circuit in the final stage of the serial connection latch group and bit lines. The flash memory further comprises a latch data transfer control circuit for transferring latch data in each circuit of the serial connection latch group in a ring shape by transferring latch data in each latch circuit of the serial connection latch group to the latch circuit in the next stage and transferring latch data in the latch circuit in the final stage to the latch circuit in the first stage. The flash memory performs write operation to a plurality of pages by repeating continuous program operation on a plurality of pages which transfers in a ring shape the data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation on a plurality of pages which transfers in a ring shape the data written to a plurality of pages stored in the plurality of latch circuits while continuously operating the voltage generating circuit to cause the circuit to continuously generate a voltage necessary for verify operation thereby continuously performing verify operation on a plurality of pages. This reduces the program voltage output stabilization wait time and the verify voltage output stabilization wait time of the voltage generating circuit thus reducing the program time. Further, write operation to next page is allowed by simply shifting latch data, which ensures high-speed data write operation. Moreover, it is possible to share a bit line connection circuit among a plurality of latch circuits thus reducing the circuit scale of the write circuit.

Further, write data is set to the latch circuits other than that for a selected page during program operation or verify operation of write data stored in the latch circuit for the selected page. This reduces the data latch time thus allowing high-speed data write operation.

The latch circuits comprise flip-flop circuits, thus data storage and latch data transfer to a plurality of latch circuits are made possible by simply inputting a clock. Thus data storage and latch data transfer to latch circuits are made easy.

(Fourth Embodiment)

A flash memory (nonvolatile semiconductor memory device) according to the fourth embodiment of the invention is detailed below referring to FIG. 10 and FIG. 11.

Figure 10:
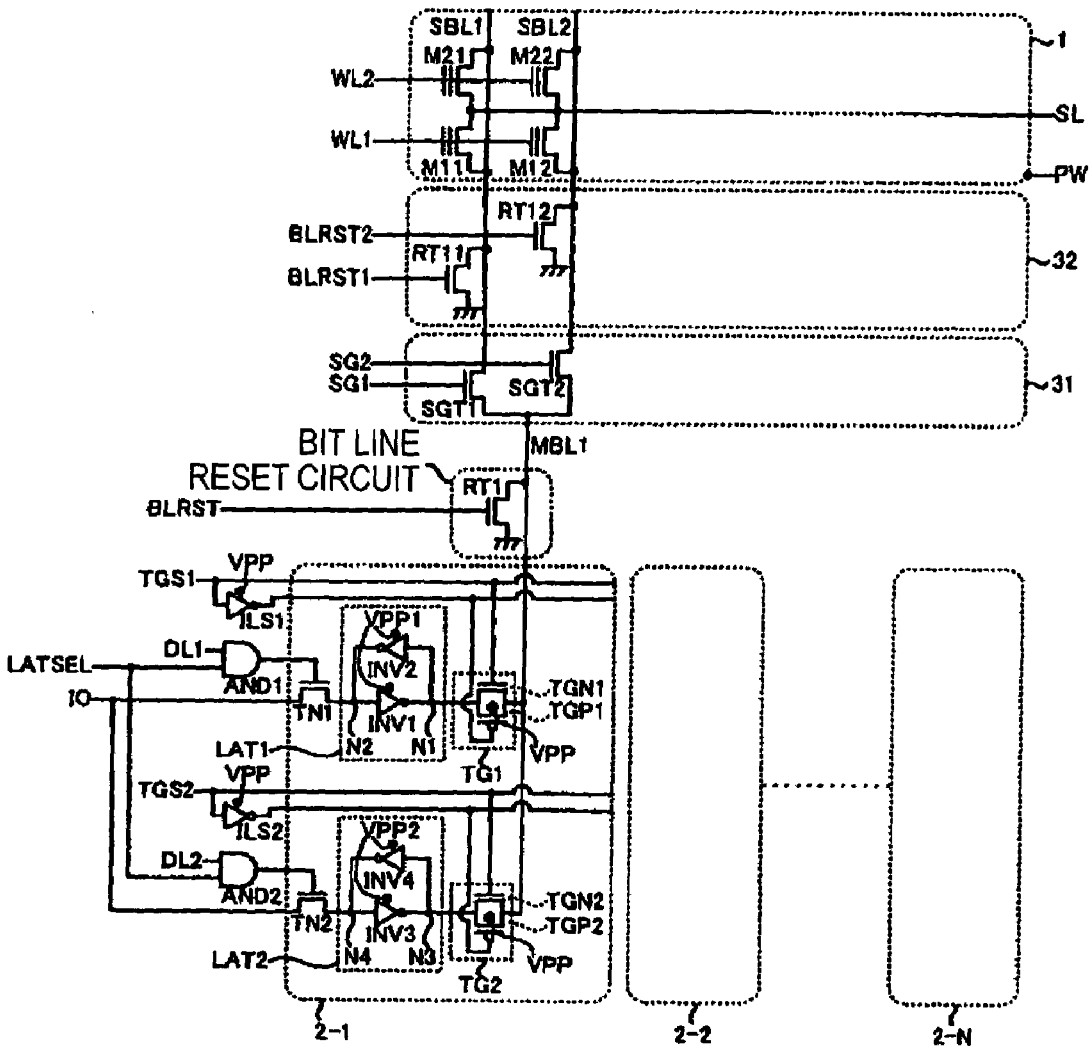
FIG. 10 shows the configuration of the memory cell array and the write circuit of a flash memory (nonvolatile semiconductor memory device) according to the fourth embodiment of the invention.

FIG. 10 shows the configuration of the memory cell array and the write circuit of a flash memory (nonvolatile semiconductor memory device) according to the fourth embodiment of the invention. Same signs and numerals are assigned to the components in FIG. 10 having the same functions as those in the first embodiment and the corresponding details are omitted. Only sections having different configurations are described below.

The difference between FIG. 10 and FIG. 4 shown in the first embodiment is that the configuration of periphery of the memory cell array is different. In FIG. 10, the write circuit 2-1 is connected to the main bit line MBL 1. The main bit line MBL 1 is connected to sub-bit lines SBL1, SBL2 via a select gate 31. To be more specific, the sub-bit line SBL1 is connected to the main bit line MBL1 via a first select gate transistor SGT1 and the connection is controlled by a first select gate control signal SG1. Similarly, the sub-bit line SBL2 is connected to the main bit line MBL1 via a second select gate transistor SGT2 and the connection is controlled by a second select gate control signal SG2.

To each sub-bit line is connected a sub-bit line reset circuit for setting a sub-bit line to a ground potential. To be more specific, to the sub-bit line SBL1 is connected a first sub-bit line reset transistor RT11 for setting the sub-bit line SBL1 to a ground potential, and the connection is controlled by a first sub-bit line reset control signal BLRST1. Similarly, to the sub-bit line SBL2 is connected a second sub-bit line reset transistor RT12 for setting the sub-bit line SBL2 to the ground potential, and the connection is controlled by a second sub-bit line reset control signal BLRST2.

To the sub-bit lines SBL1, SBL2 is connected a memory cell array 1 similar to that in the first embodiment.

The write circuit 2-1 is arranged in common between the sub-bit lines SBL1, SBL2. In such a configuration, memory cells connected to a single word line comprise a plurality of pages. In other words, memory cells connected to a word line WL1 include a memory cell M11 for Page 1 to which data is written while the sub-bit line SBL1 is selected and a memory cell M12 for Page 2 to which data is written while the sub-bit line SBL2 is selected. Memory cells connected to a word line WL2 include a memory cell M21 for Page 3 to which data is written while the sub-bit line SBL1 is selected and a memory cell M22 for Page 4 to which data is written while the sub-bit line SBL2 is selected.

As mentioned hereinabove, the flash memory according to the fourth embodiment of the invention has memory cells for a plurality of pages connected to a single word line and comprises a sub-bit line reset circuit 32 capable of individually setting sub-bit lines to the reset state. A flash memory of such a configuration is characterized by a word line voltage application control method and a method for controlling the sub-bit line reset circuit 32.

Write operation of the flash memory thus configured is described below.

Figure 11:
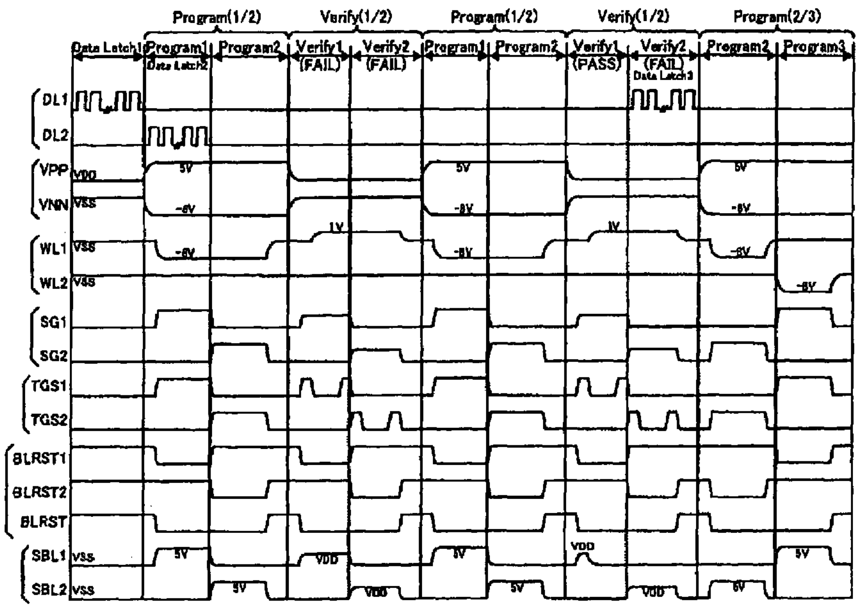
FIG. 11 is a timing chart explaining the write operation of a flash memory (nonvolatile semiconductor memory device) according to the fourth embodiment of the invention.

FIG. 11 is a timing chart explaining the write operation of a flash memory (nonvolatile semiconductor memory device) according to the fourth embodiment of the invention. The timing chart shows the operation waveforms of data latch control signals DL1, DL2, the output voltage VPP, VNN of a high voltage generating circuit, word lines WL1, WL2, select gate control signal SG1, SG2, transfer gate control signals TGS1, TGS2, bit line reset control signals BLRST1, BLRST2, BLRST, and sub-bit lines SML1, SBL2.

To start Page 1 write operation, data latch to the first latch circuit LAT1 is made by way of the first data latch control signal DL1 (Data Latch1) in the first place. During data latch period, the word lines WL1, WL2, the source line SL, and the well line PW are set to a ground potential. A first transfer gate TG1 and a second transfer gate TG2 are in the inactive state while a bit line reset circuit and a sub-bit line reset circuit 32 are in the active state. Main bit lines and sub-bit lines are set to a ground potential.

After data latch is over, the system makes a transition to the program mode. The positive high voltage generating circuit 11 and the negative high voltage generating circuit 12 respectively generate high voltages of 5 V (VPP) and −8 V (VNN) necessary for program operation. After the output voltages VPP, VNN of the positive high voltage generating circuit 11 and the negative high voltage generating circuit 12 have reached predetermined voltages, the word line WL1 is set to −8 V, the source line SL is placed in the high impedance state, the bit line reset circuit and the first sub-bit line reset transistor RT11 in the inactive state, and the first transfer gate TG1 and the first select gate transistor SGT1 in the active state, then Page 1 program operation is started (Program1). In parallel with Page 1 program operation, Page 2 write data is stored into the second latch circuit LAT2 by way of the second data latch control signal DL2 (Data Latch2).

After the program is executed for a predetermined period, with the voltage of the word line WL1 maintained at −8 V, the first select gate transistor SGT1 is placed in the inactive state, and the second select gate transistor SGT2 in the active state, and the second sub-bit line reset transistor RT12 in the inactive state and the sub-bit line SBL2 is selected, and the first transfer gate TG1 in the inactive state and the second transfer gate TG2 in the active state, then Page 2 program operation is performed (Program2). In parallel with the program operation of the sub-bit line SBL2, the first sub-bit line reset transistor RT11 is placed in the active state to set the sub-bit line SBL1 to a ground potential.

In this way, Page 2 program operation is performed with the voltage of the word line WL1 maintained at −8 V. This reduces the word line voltage rise time and voltage fall time in program operation, thereby allowing high-speed program operation. Further, it is possible to reduce the recharging/discharging count of the word line thereby providing low-power program operation. Further, the sub-bit line reset circuit 32 may be used to set non-selected sub-bit lines to a ground potential. Thus it is possible to start program operation on next page without waiting for the sub-bit line where program operation is complete to be set to the ground potential. This allows high-speed program operation.

After continuous program operation on Page 1 and Page 2 is complete, continuous verify operation on Page 1 and Page 2 is performed. Same as continuous program operation, continuous verify operation is performed with the word line WL1 set to 1 V. The sub-bit line reset circuit 32 is used to set non-selected sub-bit lines to a ground potential.

In this way, Page 2 verify operation is performed with the voltage of the word line WL1 maintained at 1 V. This reduces the word line voltage rise time and voltage fall time, thereby allowing high-speed program operation. Further, it is possible to reduce the recharging/discharging count of the word line thereby providing low-power verify operation. Further, the sub-bit line reset circuit 32 may be used to set non-selected sub-bit lines to a ground potential. Thus it is possible to start verify operation on next page without waiting for the sub-bit line where verify operation is complete to be set to the ground potential. This allows high-speed verify operation.

The subsequent continuous program operation and continuous verify operation are the same as those mentioned hereinabove, so that the corresponding description is omitted.

As mentioned hereinabove, the flash memory according to the fourth embodiment of the invention has memory cells for a plurality of pages connected to a single word line and performs continuous program operation and continuous verify operation with a voltage necessary for program operation and verify operation continuously applied to the word line. This reduces the word line voltage rise time and voltage fall time in program operation and verify operation, thereby allowing high-speed program operation and high-speed verify operation. Further, it is possible to reduce the recharging/discharging count of the word line thereby providing low-power program operation and low-power verify operation.

The flash memory further comprises a bit line reset circuit for setting non-selected bit lines to a ground potential during continuous program operation or continuous verify operation. It is thus possible to set on-selected bit lines to a ground potential during continuous program operation or continuous verify operation. As a result, it is possible to perform program operation or verify operation on next page without waiting for the bit line for a selected page to be reset to the ground potential, after the program operation or verify operation on the selected page. This allows high-speed data write operation.

(Fifth Embodiment)

A flash memory (nonvolatile semiconductor memory device) according to the fifth embodiment of the invention is detailed below referring to FIG. 12.

The fifth embodiment pertains to an operation control method for a case where a data latch time required to store write data to a latch circuit is longer than a program time or verify time per page. In the fifth embodiment, the circuit configuration and write operation by way of continuous program operation and continuous verify operation is same as those in the first through fourth embodiments, so that the corresponding details are omitted. Only a method for controlling a write command and internal operation state assumed in case the data latch time is longer than a program time or verify time per page is described below.

Figure 12A:
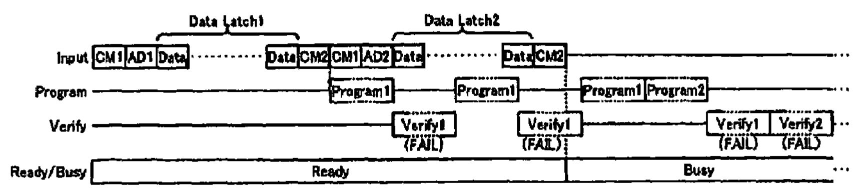
FIGS. 12A and 12B illustrate the write command and the internal operation state of a flash memory (nonvolatile semiconductor memory device) according to the fifth embodiment of the invention.

FIG. 12 shows the write command and the internal operation state of a flash memory (nonvolatile semiconductor memory device) according to the fifth embodiment of the invention. As shown in FIG. 12A, in the first place, a program command CM1 and the program address AD1 of Page 1 are input, then Page 1 write data is input. By inputting a program command CM2 after input of write data, Page 1 write operation starts. The system is in the ready state also during Page 1 program operation. In parallel with Page 1 program operation, the program command CM1 and the program address AD2 of Page 2 are input, then Page 2 write data is input. By inputting a program command CM2 after input of write data, the system enters the busy state.

The data latch time is longer than Page 1 program time so that Page 1 program operation is complete while Page 2 data latch is underway. In case Page 2 data latch operation is not over when Page 1 program operation is complete, Page 1 verify operation is executed. Page 1 program operation and verify operation are alternately performed until Page 2 data latch operation is complete.

After Page 2 data latch operation is complete, continuous program operation and continuous verify operation on Page 1 and Page 2 are performed to execute high-speed write operation.

Figure 12B:
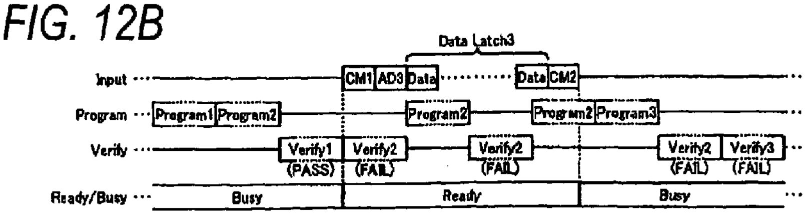

As shown in FIG. 12B, assume that continuous program operation and continuous verify operation on Page 1 and Page 2 are repeated and Page 1 verify operation is passed. Next, Page 2 verify operation is performed, when the system enters the ready state. In parallel with Page 2 verify operation, the program command CM1 and the program address AD3 of Page 3 are input, then Page 3 write data is input. By inputting a program command CM2 after input of write data, the system enters the busy state.

The data latch time is longer than Page 2 program time so that Page 2 program operation is complete while Page 3 data latch is underway. In case Page 3 data latch operation is not over when Page 2 program operation is complete, Page 2 program operation is executed. Page 2 program operation and verify operation are alternately performed until Page 3 data latch operation is complete.

After Page 3 data latch operation is complete, continuous program operation and continuous verify operation on Page 2 and Page 3 are performed to execute high-speed write operation.

As mentioned hereinabove, the flash memory according to the fifth embodiment of the invention performs continuous program operation and continuous verify operation on the non-selected pages where setting of write data is complete until setting of write data to the latch circuit for a selected page is complete, during setting of write data to the latch circuit for the selected page. This allows efficient write operation and high-speed data write operation.

While the first through fifth embodiments of the invention have been described hereinabove, a nonvolatile semiconductor memory device and a writing method thereto are not limited to those examples but various changes and modifications can be made without departing from the spirit and scope of the invention.

For example, while a flash memory has been described as an example, the invention may be applied to other nonvolatile semiconductor memories as well.

For example, while a NOR-type flash memory has been described as an example, the invention may be applied to DINOR-type, NAND-type and AND-type flash memory cell arrays as well.

For example, while a flash memory shown in FIG. 1 has been described as an example, the invention may be applied to flash memories having other configurations as well.

For example, while write circuits shown in FIG. 4, FIG. 8, FIG. 9 and FIG. 10 have been described as examples, the invention may be applied to write circuits having other configurations which perform data latch operation, program operation and verify operation as well.

For example, while a write circuit has two latch circuits in the embodiments, the invention may be applied to a write circuit having three or more latch circuits.

As mentioned hereinabove, according to an inventive nonvolatile semiconduct or memory device and a writing method thereto, a write circuit arranged per a bit line or a plurality of bit lines comprises a plurality of latch circuits and is configured to perform write operation to a plurality of pages by repeating continuous program operation which continuously performs program operations on a plurality of pages while a voltage generating circuit is continuously generating a voltage necessary for program operation and continuous verify operation which continuously performs verify operations on a plurality of pages while the voltage generating circuit is continuously generating a voltage necessary for verify operation. It is thus possible to reduce the program voltage output stabilization wait time and the verify voltage output stabilization wait time of the voltage generating circuit, thereby allowing high-speed data write operation.

Further, in parallel with program operation or verify operation on a selected page, write data can be set to the latch circuits other than that for the selected page. This reduces the reduces the data latch time thus allowing high-speed data write operation.

What is claimed is:

1. A nonvolatile semiconductor memory device comprising:

a plurality of word lines;

a plurality of bit lines;

a memory cell array including memory cells arranged in a matrix shape at the intersections of said plurality of word lines and said plurality of bit lines;

a write circuit arranged per a bit line or a plurality of bit lines in order to perform batch write operation to a page including said plurality of memory cells, said write circuit comprising a plurality of latch circuits for storing data written to a plurality of pages, and bit line connection circuits for connecting said plurality of latch circuits and bit lines;

a voltage generating circuit for generating a voltage necessary for write operation; and a control circuit for performing write operation to a plurality of pages by repeating continuous program operation which sequentially selects data written to a plurality of pages stored in said plurality of latch circuits while continuously operating said voltage generating circuit to cause the circuit to continuously generate a voltage necessary for program operation thereby continuously performing program operation on a plurality of pages, and continuous verify operation which sequentially selects data written to a plurality of pages stored in said plurality of latch circuits while continuously operating said voltage generating circuit to cause the circuit to continuously generate a voltage necessary for verify operation thereby continuously performing verify operation on a plurality of pages.

2. A nonvolatile semiconductor memory device according to claim 1, wherein the nonvolatile semiconductor memory device further comprises a control circuit for setting write data to the latch circuits other than that for a selected page during program operation or verify operation of write data stored in the latch circuit for the selected page.

3. A nonvolatile semiconductor memory device according to claim 1, wherein the nonvolatile semiconductor memory device further comprises a level shift circuit for converting the output voltage level of said latch circuit to a high voltage level between said plurality of latch circuits and said bit line connection circuits.

4. A nonvolatile semiconductor memory device according to claim 1, wherein the nonvolatile semiconductor memory device further comprises a detection circuit for detecting that memory cells are properly programmed during verify operation, a plurality of latch data reset circuits capable of individually resetting latch data in said plurality of latch circuits, and latch data reset selection circuits for selecting a predetermined latch data reset circuit in order to reset latch data in a predetermined latch circuit in case said detection circuit has detected that the memory cells are properly programmed.

5. A nonvolatile semiconductor memory device according to claim 1, wherein said plurality of latch circuits comprise flip-flop circuits.

6. A nonvolatile semiconductor memory device according to claim 1, wherein the nonvolatile semiconductor memory device further comprises a control circuit for performing continuous program operation and continuous verify operation on the pages where write data setting is complete, said page being other than said selected page, until setting of write data to the latch circuit for said selected page is complete, while setting write data to the latch circuit for the selected page.

7. A nonvolatile semiconductor memory device according to claim 1, wherein the nonvolatile semiconductor memory device further comprises a control circuit for skipping program operation and verify operation on said selected page and performing program operation and verify operation on the next page in case the write data stored in the latch circuit for the selected page contains no program data.

8. A nonvolatile semiconductor memory device according to claim 1, wherein the nonvolatile semiconductor memory device further comprises a control circuit for setting data written to a new page to the latch circuit for a page where said write operation is complete during the subsequent program operation or verify operation on the next page in case it has been detected that the memory cells for said selected page are properly programmed in the verify operation on the selected page.

9. A nonvolatile semiconductor memory device according to claim 1, said memory cell array comprising memory cells for a plurality of pages connected to a single word line, wherein the nonvolatile semiconductor memory device further comprises a control circuit for performing said continuous program operation with a voltage necessary for program operation continuously applied to said word line.

10. A nonvolatile semiconductor memory device according to claim 1, said memory cell array comprising memory cells for a plurality of pages connected to a single word line, wherein the nonvolatile semiconductor memory device further comprises a control circuit for performing said continuous verify operation with a voltage necessary for verify operation continuously applied to said word line.

11. A nonvolatile semiconductor memory device according to claim 1, said memory cell array comprising memory cells for a plurality of pages connected to a single word line, wherein the nonvolatile semiconductor memory device further comprises a bit line reset circuit for setting non-selected bit lines to a ground potential during said continuous program operation or said continuous verify operation.

12. A nonvolatile semiconductor memory device comprising:

a plurality of word lines;

a plurality of bit lines;

a memory cell array including memory cells arranged in a matrix shape at the intersections of the plurality of word lines and the plurality of bit lines;

a write circuit arranged per a bit line or a plurality of bit lines in order to perform batch write operation to a page including the plurality of memory cells, the write circuit comprising a serial connection latch group where a plurality of latch circuits are connected serially to store data written to a plurality of pages, and a bit line connection circuit for connecting the latch circuit in the final stage of the serial connection latch group and bit lines;

a voltage generating circuit for generating a voltage necessary for write operation;

a latch data transfer control circuit for transferring latch data in each circuit of the serial connection latch group in a ring shape by transferring latch data in each latch circuit of the serial connection latch group to the latch circuit in the next stage and transferring latch data in the latch circuit in the final stage to the latch circuit in the first stage; and a control circuit for performing write operation to a plurality of pages by repeating continuous program operation on a plurality of pages which transfers in a ring shape the data written to a plurality of pages stored in the plurality of latch circuits while continuously operating the voltage generating circuit to cause the circuit to continuously generate a voltage necessary for program operation thereby continuously performing program operation on a plurality of pages, and continuous verify operation on a plurality of pages which transfers in a ring shape the data written to a plurality of pages stored in the plurality of latch circuits while continuously operating the voltage generating circuit to cause the circuit to continuously generate a voltage necessary for verify operation thereby continuously performing verify operation on a plurality of pages.

13. A nonvolatile semiconductor memory device according to claim 12, wherein the nonvolatile semiconductor memory device further comprises a control circuit for setting write data to the latch circuits other than that for said selected page during program operation or verify operation of write data stored in the latch circuit for the selected page.

14. A nonvolatile semiconductor memory device according to claim 12, wherein the nonvolatile semiconductor memory device further comprises a level shift circuit for converting the output voltage level of said latch circuit in the final stage to a high voltage level between the latch circuit in the final stage of said serial connection latch group and said bit line connection circuit.

15. A nonvolatile semiconductor memory device according to claim 12, wherein the nonvolatile semiconductor memory device further comprises a detection circuit for detecting that memory cells are properly programmed during verify operation and a latch data reset circuit for resetting the latch data in the latch circuit in the final stage of said serial connection latch group in case said detection circuit has detected that the memory cells are properly programmed.

16. A nonvolatile semiconductor memory device according to claim 12, wherein said plurality of latch circuits comprise flip-flop circuits.

17. A nonvolatile semiconductor memory device according to claim 12, wherein the nonvolatile semiconductor memory device further comprises a control circuit for performing continuous program operation and continuous verify operation on the pages where write data setting is complete, said page being other than said selected page, until setting of write data to the latch circuit for said selected page is complete, while setting write data to the latch circuit for the selected page.

18. A nonvolatile semiconductor memory device according to claim 12, wherein the nonvolatile semiconductor memory device further comprises a control circuit for skipping program operation and verify operation on said selected page and performing program operation and verify operation on the next page in case the write data stored in the latch circuit for the selected page contains no program data.

19. A nonvolatile semiconductor memory device according to claim 12, wherein the nonvolatile semiconductor memory device further comprises a control circuit for setting data written to a new page to the latch circuit for a page where said write operation is complete during the subsequent program operation or verify operation on the next page in case it has been detected that the memory cells for said selected page are properly programmed in the verify operation on the selected page.

20. A nonvolatile semiconductor memory device according to claim 12, said memory cell array comprising memory cells for a plurality of pages connected to a single word line, wherein the nonvolatile semiconductor memory device further comprises a control circuit for performing said continuous program operation with a voltage necessary for program operation continuously applied to said word line.

21. A nonvolatile semiconductor memory device according to claim 12, said memory cell array comprising memory cells for a plurality of pages connected to a single word line, wherein the nonvolatile semiconductor memory device further comprises a control circuit for performing said continuous verify operation with a voltage necessary for verify operation continuously applied to said word line.

22. A nonvolatile semiconductor memory device according to claim 12, said memory cell array comprising memory cells for a plurality of pages connected to a single word line, wherein the nonvolatile semiconductor memory device further comprises a bit line reset circuit for setting non-selected bit lines to a ground potential during said continuous program operation or said continuous verify operation.

23. A method of writing to a nonvolatile semiconductor memory device comprising: a plurality of word lines; a plurality of bit lines; a memory cell array including memory cells arranged in a matrix shape at the intersections of said plurality of word lines and said plurality of bit lines; a write circuit arranged per a bit line or a plurality of bit lines, said write circuit comprising a plurality of latch circuits for storing data written to a plurality of pages, and a bit line connection circuit for connecting said plurality of latch circuits and bit lines in order to perform batch write operation to a page including said plurality of memory cells; and a voltage generating circuit for generating a voltage necessary for write operation;

wherein said method performs the following operations:

a continuous program operation on a plurality of pages which sequentially selects data written to a plurality of pages stored in said plurality of latch circuits while continuously operating said voltage generating circuit to cause the circuit to continuously generate a voltage necessary for program operation thereby continuously performing program operation on a plurality of pages;

a continuous verify operation on a plurality of pages which sequentially selects data written to a plurality of pages stored in said plurality of latch circuits while continuously operating said voltage generating circuit to cause the circuit to continuously generate a voltage necessary for verify operation thereby continuously performing verify operation on a plurality of pages; and repeating the continuous program operation and the continuous verify operation to thereby perform a write operation to a plurality of pages.

24. A method of writing to a nonvolatile semiconductor memory device according to claim 23, wherein the method sets write data to the latch circuits other than that for said selected page during program operation or verify operation of write data stored in the latch circuit for the selected page.

25. A method of writing to a nonvolatile semiconductor memory device according to claim 23, wherein the method performs continuous program operation and continuous verify operation on the pages where write data setting is complete, said page being other than said selected page, until setting of write data to the latch circuit for said selected page is complete, while setting write data to the latch circuit for the selected page.

26. A method of writing to a nonvolatile semiconductor memory device according to claim 23, wherein the method skips program operation and verify operation on said selected page and performs program operation and verify operation on the next page in case the write data stored in the latch circuit for the selected page contains no program data.

27. A method of writing to a nonvolatile semiconductor memory device according to claim 23, wherein the method sets data written to a new page to the latch circuit for a page where said write operation is complete during the subsequent program operation or verify operation on the next page in case it has been detected that the memory cells for said selected page are properly programmed in the verify operation on the selected page.

28. A method of writing to a nonvolatile semiconductor memory device according to claim 23, said memory cell array comprising memory cells for a plurality of pages connected to a single word line, wherein the method performs said continuous program operation with a voltage necessary for program operation continuously applied to said word line.

29. A method of writing to a nonvolatile semiconductor memory device according to claim 23, said memory cell array comprising memory cells for a plurality of pages connected to a single word line, wherein the method performs said continuous verify operation with a voltage necessary for verify operation continuously applied to said word line.

30. A method of writing to a nonvolatile semiconductor memory device comprising: a plurality of word lines; a plurality of bit lines; a memory cell array including memory cells arranged in a matrix shape at the intersections of said plurality of word lines and said plurality of bit lines; a write circuit arranged per a bit line or a plurality of bit lines in order to perform batch write operation to a page including said plurality of memory cells, said write circuit comprising a serial connection latch group where a plurality of latch circuits are connected serially to store data written to a plurality of pages, and a bit line connection circuit for connecting the latch circuit in the final stage of said serial connection latch group and bit lines; a latch data transfer control circuit for transferring latch data in each circuit of said serial connection latch group in a ring shape by transferring latch data in each latch circuit of said serial connection latch group to the latch circuit in the next stage and transferring latch data in the latch circuit in the final stage to the latch circuit in the first stage; and a voltage generating circuit for generating a voltage necessary for write operation;

wherein said method performs the following operations:

a continuous program operation on a plurality of pages which transfers in a ring shape the data written to a plurality of pages stored in said plurality of latch circuits while continuously operating said voltage generating circuit to cause the circuit to continuously generate a voltage necessary for program operation thereby continuously performing program operation on a plurality of pages;

a continuous verify operation on a plurality of pages which transfers in a ring shape the data written to a plurality of pages stored in said plurality of latch circuits while continuously operating said voltage generating circuit to cause the circuit to continuously generate a voltage necessary for verify operation thereby continuously performing verify operation on a plurality of pages; and repeating the continuous program operation and the continuous verify operation to thereby perform a write operation to a plurality of pages.

31. A method of writing to a nonvolatile semiconductor memory device according to claim 30, wherein write data setting is made to the latch circuits other than that for said selected page during program operation or verify operation of write data stored in the latch circuit for the selected page.

32. A method of writing to a nonvolatile semiconductor memory device according to claim 30, wherein the method performs continuous program operation and continuous verify operation on the pages where write data setting is complete, said page being other than said selected page, until setting of write data to the latch circuit for said selected page is complete, while setting write data to the latch circuit for the selected page.

33. A method of writing to a nonvolatile semiconductor memory device according to claim 30, wherein the method skips program operation and verify operation on said selected page and performs program operation and verify operation on the next page in case the write data stored in the latch circuit for the selected page contains no program data.

34. A method of writing to a nonvolatile semiconductor memory device according to claim 30, wherein the method sets data written to a new page to the latch circuit for a page where said write operation is complete during the subsequent program operation or verify operation on the next page in case it has been detected that the memory cells for said selected page are properly programmed in the verify operation on the selected page.

35. A method of writing to a nonvolatile semiconductor memory device according to claim 30, said memory cell array comprising memory cells for a plurality of pages connected to a single word line, wherein the method performs said continuous program operation with a voltage necessary for program operation continuously applied to said word line.

36. A method of writing to a nonvolatile semiconductor memory device according to claim 30, said memory cell array comprising memory cells for a plurality of pages connected to a single word line, wherein the method performs said continuous verify operation with a voltage necessary for verify operation continuously applied to said word line.

* * * * *